(12) United States Patent
Sloboda et al.

(10) Patent No.: US 10,673,389 B2
(45) Date of Patent: Jun. 2, 2020

(54) CHOPPER AMPLIFIERS WITH HIGH PASS FILTER FOR SUPPRESSING CHOPPING RIPPLE

(71) Applicant: Linear Technology Holding LLC, Norwood, MA (US)

(72) Inventors: Alex R. Sloboda, North Port, FL (US); Gregory L. DiSanto, Groton, MA (US); Andrew K. Roberts, Maynard, MA (US)

(73) Assignee: Linear Technology Holding LLC, Norwood, MA (US)

( * ) Notice: Subject to any disclaimer, the term of this patent is extended or adjusted under 35 U.S.C. 154(b) by 0 days.

(21) Appl. No.: 16/124,737

(22) Filed: Sep. 7, 2018

(65) Prior Publication Data

US 2019/0158034 A1     May 23, 2019

Related U.S. Application Data

(60) Provisional application No. 62/588,784, filed on Nov. 20, 2017.

(51) Int. Cl.
| | | |
|---|---|---|
| *H03F 1/02* | (2006.01) | |
| *H03F 1/26* | (2006.01) | |
| *H03F 3/45* | (2006.01) | |
| *H03F 3/387* | (2006.01) | |

(52) U.S. Cl.
CPC .............. *H03F 1/26* (2013.01); *H03F 3/387* (2013.01); *H03F 3/45179* (2013.01); *H03F 3/45475* (2013.01); *H03F 2200/135* (2013.01); *H03F 2200/168* (2013.01); *H03F 2200/267* (2013.01); *H03F 2200/271* (2013.01); *H03F 2200/375* (2013.01); *H03F 2200/459* (2013.01);

(Continued)

(58) Field of Classification Search
CPC ... H03F 1/02; H03F 3/005; H03F 3/45; H03F 3/191
USPC .............................................. 330/9; 327/124
See application file for complete search history.

(56) References Cited

U.S. PATENT DOCUMENTS

| | | | | |
|---|---|---|---|---|
| 4,048,574 A | * | 9/1977 | Barbier | ..................... H03F 3/38 330/9 |
| 7,038,532 B1 | * | 5/2006 | Bocko | ..................... G06G 7/186 327/337 |
| 7,292,095 B2 | | 11/2007 | Burt et al. | |

(Continued)

OTHER PUBLICATIONS

Belloni et al., "A Micropower Chopper—CDS Operational Amplifier" IEEE Journal of solid-State Circuits, vol. 45, No. 12, Dec. 2010, in 9 pages.

(Continued)

*Primary Examiner* — Steven J Mottola
(74) *Attorney, Agent, or Firm* — Knobbe, Martens, Olson & Bear, LLP

(57) ABSTRACT

Chopper amplifiers with high pass filters for suppressing chopping ripple are provided herein. In certain embodiments, a chopper amplifier includes an input chopping circuit, an amplification circuit, a low frequency content detection circuit, and an output chopping circuit electrically connected in a cascade. The low frequency content detection circuit operates in combination with a transconductance or other gain circuit as a high pass filter that filters input offset voltage and/or low frequency noise of the amplification circuit, thereby suppressing output chopping ripple from arising.

20 Claims, 15 Drawing Sheets

(52) U.S. Cl.
CPC .............. *H03F 2203/45012* (2013.01); *H03F 2203/45212* (2013.01); *H03F 2203/45512* (2013.01)

(56) References Cited

U.S. PATENT DOCUMENTS

| | | | |
|---|---|---|---|
| 7,764,118 | B2 | 7/2010 | Kusuda et al. |
| 8,120,422 | B1 | 2/2012 | Huijsing et al. |
| 8,125,262 | B2 | 2/2012 | Kusuda |
| 8,203,357 | B2 | 6/2012 | Kusuda et al. |
| 8,542,066 | B2 | 9/2013 | Kusuda |
| 8,754,799 | B2 | 6/2014 | Coln et al. |
| 8,837,099 | B2 | 9/2014 | Coln et al. |
| 9,123,104 | B2 | 9/2015 | Kusuda et al. |
| 9,246,484 | B2 | 1/2016 | Kusuda |
| 9,496,833 | B2 | 11/2016 | Kusuda |
| 9,564,859 | B2 | 2/2017 | Ivanov et al. |
| 9,584,079 | B2 | 2/2017 | Ouchi |
| 9,998,079 | B2 | 6/2018 | Splithof |
| 2017/0230019 | A1 | 8/2017 | Chandrakumar et al. |

OTHER PUBLICATIONS

Bilotti et al., "Chopper-Stabilized Amplifiers with a Track-and-Hold Signal Demodulator" Allegro Microsystems, LLC, Published in IEEE Transactions on Circuits and Systems, I: Fundamental Theory and Applications, vol. 46, No. 4, Apr. 1999, in 8 pages.

Burt, et al., "A Micropower Chopper-Stabilized Operational Amplifier Using a SC Notch Filter With Synchronous Integration Inside the Continuous-Time Signal Path" IEEE Journal of Solid-State Circuits, vol. 41, No. 12, Dec. 2006, in 8 pages.

Chandrakumar et al., "A Simple Area-Efficient Ripple-Rejection Technique for Chopped Biosignal Amplifiers" IEEE Transactions on Circuits and Systems—II Express Briefs, vol. 62, No. 2, Feb. 2015 in 5 pages.

Fan, et al., "A 21 nV/ Hz Chopper-Stabilized Multi-Path Current-Feedback Instrumentation Amplifier With 2 µV Offset" IEEE Journal of Solid-State Circuits, vol. 47, No. 2, Feb. 2012, in 12 pages.

Kusuda, Y., PhD. Thesis titled "Reducing Switching Artifacts in Chopper Amplifiers" dated Apr. 30, 2018, in 208 pages.

Sloboda, A., Thesis titled "AC Coupled Ripple Reduction Method for Chopper-Stabilized Amplifiers," Massachusetts Institute of Technology, Jun. 2018, in 43 pages.

Wu, et al., "A Chopper Current-Feedback Instrumentation Amplifier with a 1 mHz 1/f Noise Corner and an ACCoupled Ripple-Reduction Loop" with Visual Supplement, ISSCC 2009, Session 19, Analog Techniques, 19.1, IEEE International Solid-State Circuits Conference, in 35 pages.

Yates et al., "An Ultra Low Power Noise Chopper Amplifier for Wireless EEG" Circuits and Systems Research Group, IEEE 2006 in 4 pages.

* cited by examiner

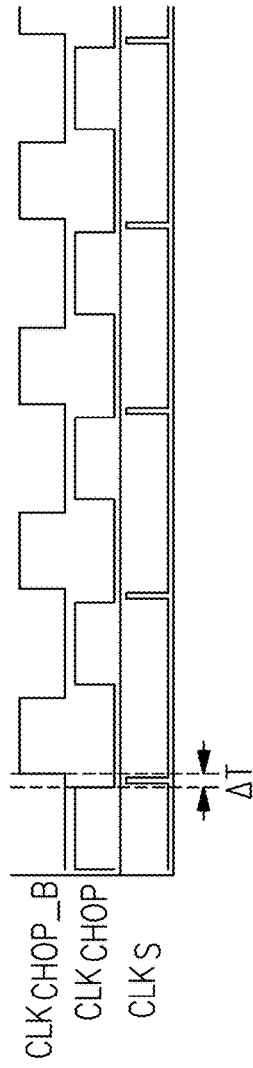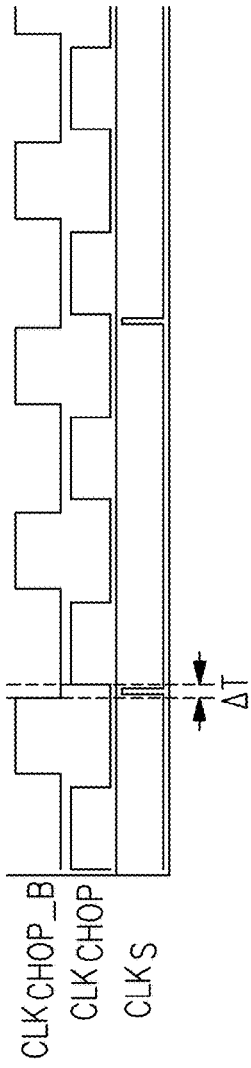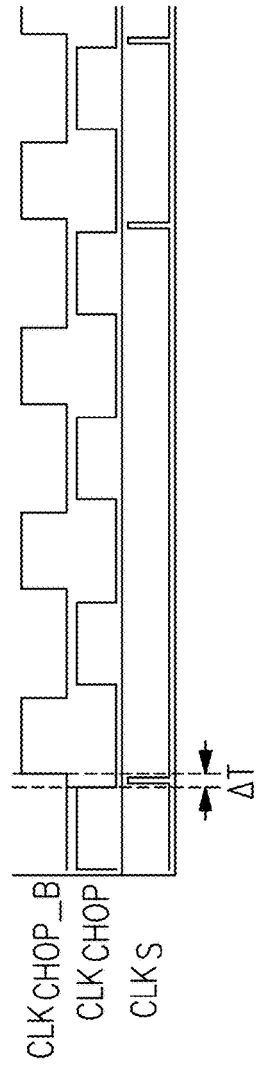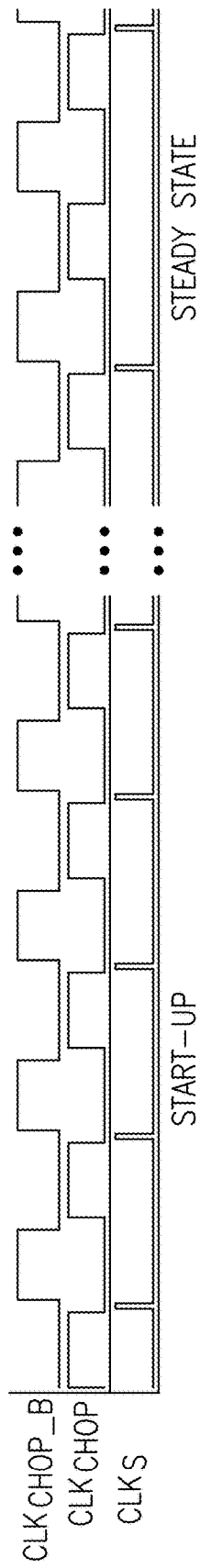

CHOPPER AMPLIFIERS WITH HIGH PASS FILTER FOR SUPPRESSING CHOPPING RIPPLE

CROSS-REFERENCE TO RELATED APPLICATIONS

The present application claims priority to U.S. Provisional Patent Application No. 62/588,784, filed Nov. 20, 2017, and titled "CHOPPER NOISE REDUCTION TECHNIQUE," the entirety of which is hereby incorporated herein by reference.

FIELD OF THE DISCLOSURE

Embodiments of the invention relate to electronic systems, and more particularly, to amplifiers.

BACKGROUND

An amplifier, such as an operational or instrumentation amplifier, can include chopper circuitry to help compensate for the amplifier's input offset voltage. For example, a chopper amplifier can include an input chopping circuit that can be used to chop the amplifier's input signal during an input chopping operation, thereby up shifting the frequency of the amplifier's input signal. The chopper amplifier can further include an amplification circuit for amplifying the chopped input signal, and an output chopping circuit for down shifting the frequency of the amplified signal during an output chopping operation. By providing chopping in this manner, the amplifier's input offset voltage is separated in frequency from the chopped input signal, and thus can be filtered.

SUMMARY OF THE DISCLOSURE

Chopper amplifiers with high pass filters for suppressing chopping ripple are provided herein. In certain embodiments, a chopper amplifier includes an input chopping circuit, an amplification circuit, a low frequency content detection circuit, and an output chopping circuit electrically connected in a cascade. The low frequency content detection circuit operates in combination with a transconductance or other gain circuit as a high pass filter that filters input offset voltage and/or low frequency noise of the amplification circuit, thereby suppressing output chopping ripple from arising. The high pass filtering reduces or eliminates a wide bandwidth of low frequency input noise sources and DC offset, including, but not limited to, flicker noise and/or input offset voltage. This in turn leads to reduced output chopping ripple, lower flicker noise current, and/or enhanced spectral output purity of the chopper amplifier.

In one aspect, a chopper amplifier with high pass filtering for suppressing chopping ripple is provided. The chopper amplifier includes an input chopping circuit configured to generate a chopped differential input signal based on chopping a differential input signal, an amplification circuit configured to amplify the chopped differential input signal to provide an amplified differential signal at a differential output, an output chopping circuit electrically connected to the input chopping circuit by way of a differential signal path through the amplification circuit, and a high pass filter configured to provide high pass filtering to the amplified differential signal based on providing feedback from the differential output of the amplification circuit to the differential signal path.

In another aspect, a method of amplification with suppressed chopping ripple is provided. The method includes chopping a differential input signal with a chopping clock signal to generate a chopped differential input signal, amplifying the differential input signal to generate an amplified differential signal using an amplification circuit, chopping the amplified differential signal with the chopping clock signal to generate a chopped output signal, and high pass filtering the amplified differential signal by providing feedback from a differential output of the amplification circuit to a differential signal path through the amplification circuit.

In another aspect, a chopper amplifier with high pass filtering for suppressing chopping ripple is provided. The chopper amplifier includes an input chopping circuit configured to generate a chopped differential input signal based on chopping a differential input signal, an amplification circuit configured to amplify the chopped differential input signal to provide an amplified differential signal at a differential output, an output chopping circuit electrically connected to the input chopping circuit by way of a differential signal path through the amplification circuit, and a means for high pass filtering the amplified differential signal electrically coupled between the differential output of the amplification circuit and the differential signal path.

BRIEF DESCRIPTION OF THE DRAWINGS

FIG. 9A is another example of a timing diagram for chopper amplifier circuitry.

FIG. 9B is another example of a timing diagram for chopper amplifier circuitry.

FIG. 9C is another example of a timing diagram for chopper amplifier circuitry.

FIG. 9D is another example of a timing diagram for chopper amplifier circuitry.

DETAILED DESCRIPTION OF EMBODIMENTS

Figure 1:
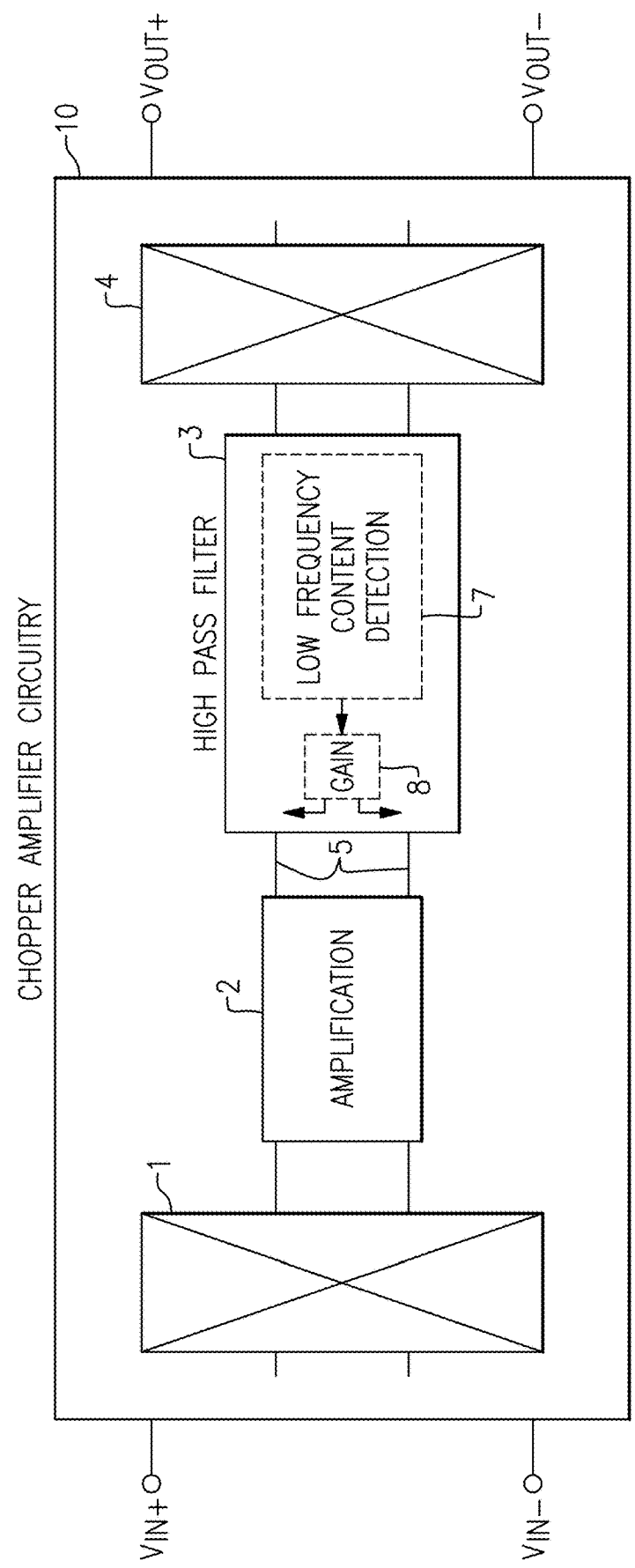
FIG. 1 is a schematic diagram of chopper amplifier circuitry according to one embodiment.

The following detailed description of embodiments presents various descriptions of specific embodiments of the invention. However, the invention can be embodied in a multitude of different ways. In this description, reference is made to the drawings where like reference numerals may indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Absent compensation, an amplifier can have an input offset voltage and/or low frequency noise, such as flicker or 1/f noise having an associated noise power spectral density (PSD) that becomes larger at lower frequencies.

To reduce or remove input offset voltage and/or low frequency noise, an amplifier can include chopper circuitry. In one example, a chopper amplifier includes an input chopping circuit that chops or modulates the amplifier's input signal during an input chopping operation, thereby up-shifting the frequency of the amplifier's input signal. Furthermore, the chopper amplifier includes an amplification circuit that amplifies the chopped input signal, and an output chopping circuit that chops or demodulates the amplified signal during an output chopping operation. By providing chopping in this manner, the amplifier's input offset voltage and/or low frequency noise is separated in frequency from the desired signal, and thus can be filtered.

In certain implementations, a chopper amplifier can further include autozero circuitry. Including both autozero and chopper circuitry in a chopper amplifier can further lower overall input offset voltage and/or low frequency noise. The teachings herein are applicable not only to chopper amplifiers that provide chopping, but also to chopper amplifiers that combine chopping with autozeroing and/or other compensation schemes.

An amplifier's chopping operations can result in ripple appearing in the amplifier's output voltage. The chopping ripple can have a magnitude that changes in relation to the magnitude of the amplifier's input offset voltage and/or low frequency noise. Thus, chopping may result in the amplifier's input offset voltage and/or low frequency noise not being cancelled, but instead being modulated up by the chopping frequency to generate chopping ripple that corrupts the spectral integrity of the amplifier's output signal. Furthermore, chopping can result in aliased flicker noise and/or other undesirable performance degradation.

Although a low-pass post filter can be included after the output chopping circuit to filter chopping ripple associated with modulated input offset voltage and/or modulated low frequency noise, it can be desirable to reduce the amplifier's input offset voltage and/or low frequency noise to avoid a need for a post filter or to relax a design constraint of the post filter. In another example, a switched capacitor notch filter can be included after the output chopping circuit to provide attenuation of chopping ripple. However, such switched capacitor notch filters may provide too narrow a bandwidth and/or lack adjustable frequency characteristics to attenuate wide flicker noise bandwidths.

Feedback or feedforward correction paths can also be used to suppress chopping ripple. However, certain feedback or feedforward correction paths can cause signal distortion by introducing anomalies in the amplifier's frequency response characteristics. For example, certain chopping ripple suppression schemes may result in the appearance of notches near the chopping frequency in a plot of the amplifier's gain versus frequency. Although an amplifier can be implemented to include a high-frequency signal compensation path to help compensate for such notches, the high-frequency signal compensation path may add complexity, increase component count, raise power consumption, and/or not fully compensate for the notch. Furthermore, if an out-of-range signal is applied as an input to such an amplifier, the amplifier's loop may be disturbed and the amplifier may exhibit a relatively slow settling time and/or instability.

Thus, conventional techniques suffer from a number of drawbacks. Absent compensation, input offset voltage and/or low frequency noise are significant factors that will impair functionality of a precision amplifier. Furthermore, in low power applications it may not be feasible to reduce low frequency noise by operating the amplifier with a higher power consumption or bias current.

Chopper amplifiers with high pass filters for suppressing chopping ripple are provided herein. In certain embodiments, a chopper amplifier includes an input chopping circuit, an amplification circuit, a low frequency content detection circuit, and an output chopping circuit electrically connected in a cascade. The low frequency content detection circuit operates in combination with a transconductance or other gain circuit as a high pass filter that filters input offset voltage and/or low frequency noise of the amplification circuit, thereby suppressing output chopping ripple from arising.

The high pass filter operates to provide high pass filtering to an amplified differential signal provided at a differential output of the amplification circuit, thereby filtering input offset voltage and/or low frequency noise. In certain implementations, a differential input of the output chopping circuit is electrically connected to the input chopping circuit by way of a differential signal path through the amplification circuit, and the high pass filter provides high pass filtering to the amplified differential signal based on providing feedback from the differential output of the amplification circuit to the differential signal path. For example, the low frequency content detection circuit can detect a low frequency signal content at the differential output of the amplification circuit, which is used by the transconductance circuit to compensate the differential signal path for low frequency noise.

In certain implementations, the low frequency content detection circuit corresponds to an integration circuit including a pair of integration capacitors connected between the differential output of the amplification circuit and the differential input of the output chopping circuit. Additionally, the integrated voltage of the integration capacitors is provided to the input of the transconductance circuit, which outputs a differential compensation signal to thereby compensate for low frequency noise sources.

In certain implementations, the transconductance circuit corresponds to a portion of the amplification circuit, thereby avoiding a need to add additional transconductance circuitry. For instance, the transconductance circuit can correspond to transconductance provided by back gates of a pair of field-effect transistors (FETs) operating in the amplification circuit. In other implementations, a separate transconductance circuit is included, for instance, a transconductance stage including an input that receives the detected low frequency content and a differential output coupled to the differential signal path.

The noise reduction techniques herein can operate to reduce or eliminate a wide bandwidth of low frequency input noise sources and DC offset, including, but not limited to, flicker noise and/or input offset voltage. This in turn leads to reduced output chopping ripple, lower flicker noise current, and/or enhanced spectral output purity of the chopper amplifier.

FIG. 1 is a schematic diagram of chopper amplifier circuitry 10 according to one embodiment. The chopper amplifier circuit 10 includes an input chopping circuit 1, an amplification circuit 2, a high pass filter 3, and an output chopping circuit 4. As shown in FIG. 1, the output chopping circuit 4 is electrically connected to the input chopping circuit 1 by way of a differential signal path 5 through the amplification circuit 2.

Although certain components of the chopper amplifier circuitry 10 are shown, the chopper amplifier circuitry 10 can include additional components or circuits, including, but not limited to, one or more additional amplification stages, output stages, feedforward compensation paths, and/or feedback compensation paths. Accordingly, other implementations are possible.

The chopper amplifier circuitry 10 receives a differential input signal between a positive or non-inverted input voltage terminal $V_{IN+}$ and a negative or inverted input voltage terminal $V_{IN-}$, which operate as a pair of differential input terminals $V_{IN+}$, $V_{IN-}$. The chopper amplifier circuitry 10 also output a differential output signal between a positive or non-inverted output voltage terminal $V_{IN+}$ and a negative or inverted output voltage terminal $V_{IN-}$, which operate as a pair of differential output terminals $V_{OUT+}$, $V_{OUT-}$.

Although FIG. 1 illustrates a configuration in which the chopper amplifier circuitry 10 generates a differential output signal, the chopper amplifier circuitry 10 can be adapted to generate other output signals, including, for example, a single-ended output signal. Additionally, although FIG. 1 illustrates the chopper amplifier circuitry 10 in an open-loop configuration, the chopper amplifier circuitry 10 can be used in closed-loop configurations.

The input chopping circuit 1 operates to chop or modulate the differential input signal to generate a chopped differential input signal, which is amplified by the amplification circuit 2 to generate an amplified differential signal. The amplification circuit 2 can be implemented in a wide variety of ways, and can include one or more amplification stages.

With continuing reference to FIG. 1, the chopping operation of the input chopping circuit 1 upshifts the frequency of the differential input signal. For example, in certain implementations the chopping clock signal of the input chopping circuit 1 is a square wave, which can be equivalently represented by a Fourier series of sine waves at the chopping frequency and at odd harmonics thereof. By modulating the differential input signal by such a square wave, the frequency content of the differential input signal is upshifted.

Accordingly, the chopped differential input signal includes signal content at the chopping frequency and odd harmonics thereof. Thus, the chopped differential input signal is separated in frequency from input offset voltage and/or low frequency noise of the amplification circuit 2.

The high pass filter 3 operates to filter input offset voltage and/or low frequency noise present in the amplified differential signal from the amplification circuit 2, thereby enhancing performance of the chopper amplifier circuitry 10. For example, by filtering such low frequency noise prior to output chopping, generation of chopping voltage ripple in the differential output signal is reduced or eliminated. Thus, the noise reduction schemes herein can provide enhanced performance relative to implementations only using post filters after an output chopping circuit to reduce chopping ripple arising from modulation of input offset voltage and/or low frequency noise.

The differential filtered signal from the high pass filter 3 is chopped by the output chopping circuit 10, thereby downshifting signal frequency content. The chopped differential output signal can be outputted with or without further processing (for instance, amplification, filtering and/or integration) to generate the differential output signal of the chopper amplifier circuitry 10.

As shown in FIG. 1, the high pass filter 3 includes a low frequency content detection circuit 7 and a gain circuit 8. The low frequency content detection circuit 7 generates a detection signal based on detecting low frequency content of the amplified differential signal from the amplification circuit 2. Since the input chopping circuit 1 upshifts the frequency of signal content, the detected low frequency content corresponds to undesirable input offset voltage and/or low frequency noise of the amplification circuit 2. The detection signal is provided to the gain circuit 8, which compensates the differential signal path 5 for low frequency noise and input offset voltage.

Accordingly, the low frequency content detection circuit 7 operates in combination with the gain circuit 8 as the high pass filter 3 for filtering input offset voltage and/or low frequency noise of the amplification circuit 2.

In certain implementations, the low frequency content detection circuit 3 includes a pair of integration capacitors connected between a differential output of the amplification circuit 2 and a differential input of the output chopping circuit 4 and that operate to detect low frequency noise. Additionally, the detected noise is provided to the input of the gain circuit 8, which outputs a differential compensation signal to thereby compensate for low frequency noise sources and input offset voltage.

In certain implementations, the gain circuit 8 corresponds to a portion of the amplification circuit 3, thereby avoiding a need to add additional amplification circuitry. Thus, although illustrated as separate from the amplification circuit 2 in FIG. 1, the gain circuit 8 can be integrated therein in certain implementations. In other implementations, the gain circuit 8 is implemented as a separate amplification circuit from the amplification circuit 2, for instance, a gain stage including an input that receives the detection signal and an output that provides a differential compensation signal to the differential signal path 5.

In certain implementations, the high pass filter 3 has a filter corner frequency that is substantially independent of the chopping frequency at which the input chopping circuit 1 and/or output chopping circuit 4 are operated. Thus, the corner frequency of the high pass filter 3 can be selected to provide a suitable amount of filtering for a particular application and/or processing technology, without needing to be constrained by the chopping frequency.

In contrast, certain conventional ripple filters, such as certain switched capacitor notch filters, provide a filtering characteristic (for instance, a filter corner frequency and/or filter center frequency) that is based on the chopping frequency. However, when the filtering characteristic is dependent on chopping frequency, the input and output choppers may need to operate at an undesired frequency to obtain a desired filtering characteristic.

Accordingly, the noise reduction schemes herein can also provide enhanced flexibility. For example, not only can the high pass filter 3 reduce or eliminate low frequency input noise sources and/or DC offset, but in certain implementations the bandwidth of such filtering can be selected substantially independent of the chopping frequency to thereby achieve desired filtering. Thus, in applications and/or processing technologies with a large amount of low frequency noise, a wide filtering bandwidth can be provided to reduce output chopping ripple, to lower flicker noise current, and/or to enhance spectral output purity.

In certain implementations, one or more parameters of the high pass filter 3 (for instance, an amount of gain provided by the gain circuit 8) are controllable (for instance, variable and/or programmable) to thereby provide a controllable corner frequency. Thus, in such implementations, the filtering characteristics of the high pass filter 3 can be changed by analog and/or digital control.

Figure 2A:
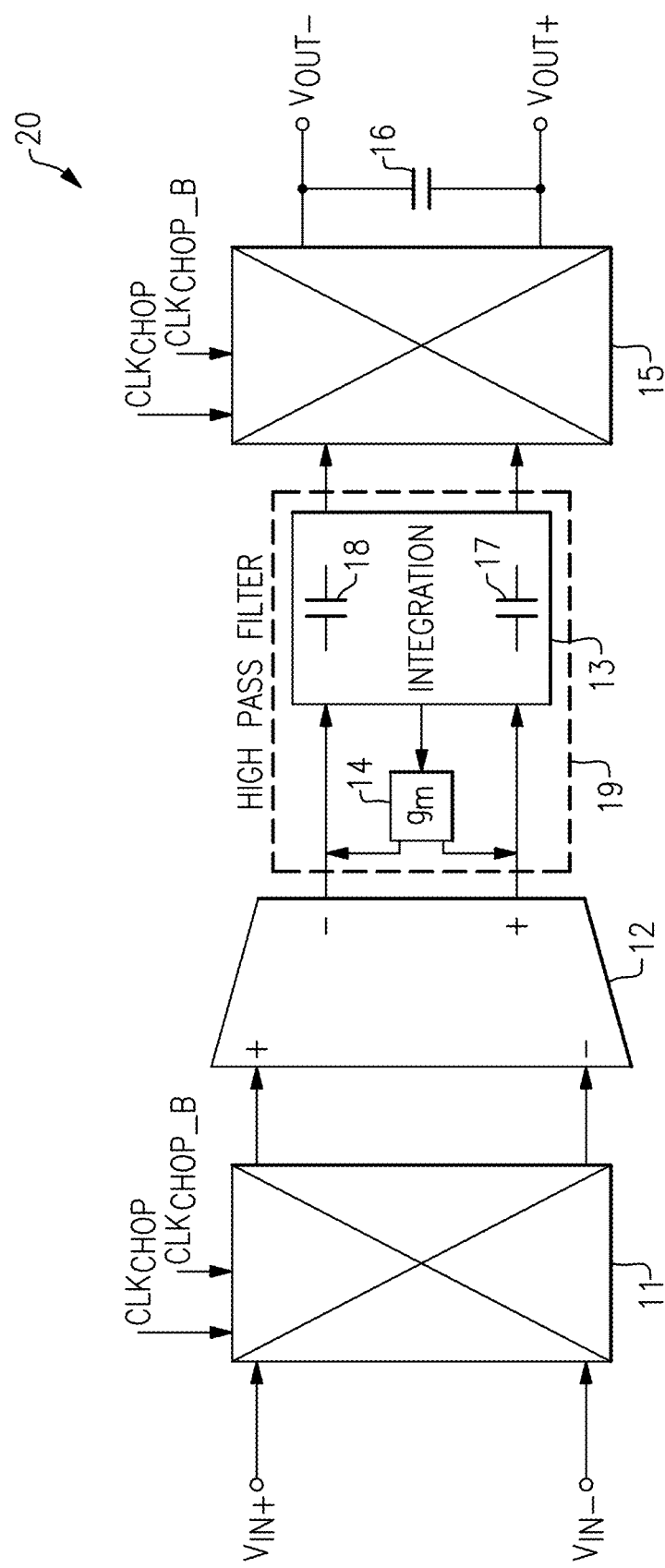
FIG. 2A is a schematic diagram of chopper amplifier circuitry according to another embodiment.

FIG. 2A is a schematic diagram of chopper amplifier circuitry 20 according to another embodiment. The chopper amplifier circuitry 20 includes an input chopping circuit 11, a transconductance amplification stage 12, an integration circuit 13, a transconductance circuit 14, an output chopping circuit 15, and an accumulation capacitor 16. The integration circuit 13 and the transconductance circuit 14 operate in combination with one another as a high pass filter 19 for filtering input offset voltage and/or low frequency noise of the transconductance amplification stage 12.

The high pass filter 19 of FIG. 2A illustrates one embodiment of a high pass filter for a chopper amplifier. However, the teachings herein are applicable to high pass filters implemented in a wide variety of ways. Accordingly, other implementations are possible.

As shown in FIG. 2A, the input chopping circuit 11 and the output chopping circuit 15 each receive a chopping clock signal $CLK_{CHOP}$ and an inverted chopping clock signal $CLK_{CHOP\_B}$, which operate at a chopping frequency. In certain implementations, the inverted chopping clock signal $CLK_{CHOP\_B}$ corresponds to a logically inverted version of the chopping clock signal $CLK_{CHOP}$, with or without clock overlap. The input chopping circuit 11 chops a differential input signal received between the pair of differential input terminals $V_{IN+}$, $V_{IN-}$. The transconductance amplification stage 12 amplifies the chopped differential input signal to generate an amplified differential signal.

The integration circuit 18 includes a first integration capacitor 17 that operates to integrate a non-inverted signal component of the amplified differential signal, and a second integration capacitor 18 that operates to integrate an inverted signal component of the amplified differential signal.

The difference between the voltages of the first integration capacitor 17 and the second integration capacitor 18 represent input offset voltage and/or low frequency noise of the transconductance amplification stage 12. Thus, the integration circuit 13 uses the first integration capacitor 17 and the second integration capacitor 18 to generate an integration voltage to the transconductance circuit 14. Although the input signal to the transconductance circuit 14 is illustrated as singled-ended, the input signal to the transconductance circuit 14 can be implemented differentially and/or using multiple signals. In the illustrated embodiment, the transconductance circuit 14 includes an input that receives an integration voltage from the integration circuit 13 and a differential output coupled to the differential output of the transconductance amplification stage 12.

The transconductance circuit 14 operates to provide feedback that reduces or eliminates input offset voltage and/or low frequency noise arising from the transconductance amplification stage 12. In particular, the integration circuit 13 and the transconductance circuit 14 operate in combination with one another as a high pass filter 19 that provides filtering to reduce output chopping ripple, lower flicker noise current, and/or enhance spectral output purity.

As shown in FIG. 2A, the differential filtered signal is chopped by the output chopping circuit 15 to generate a chopped differential output current, which is accumulated by the accumulation capacitor 16 to generate a differential output signal between the pair of differential output terminals $V_{OUT+}$, $V_{OUT-}$. In certain implementations, the differential output signal is further processed (for instance, using an output stage, filter, integrator, and/or other suitable circuitry).

Figure 2B:
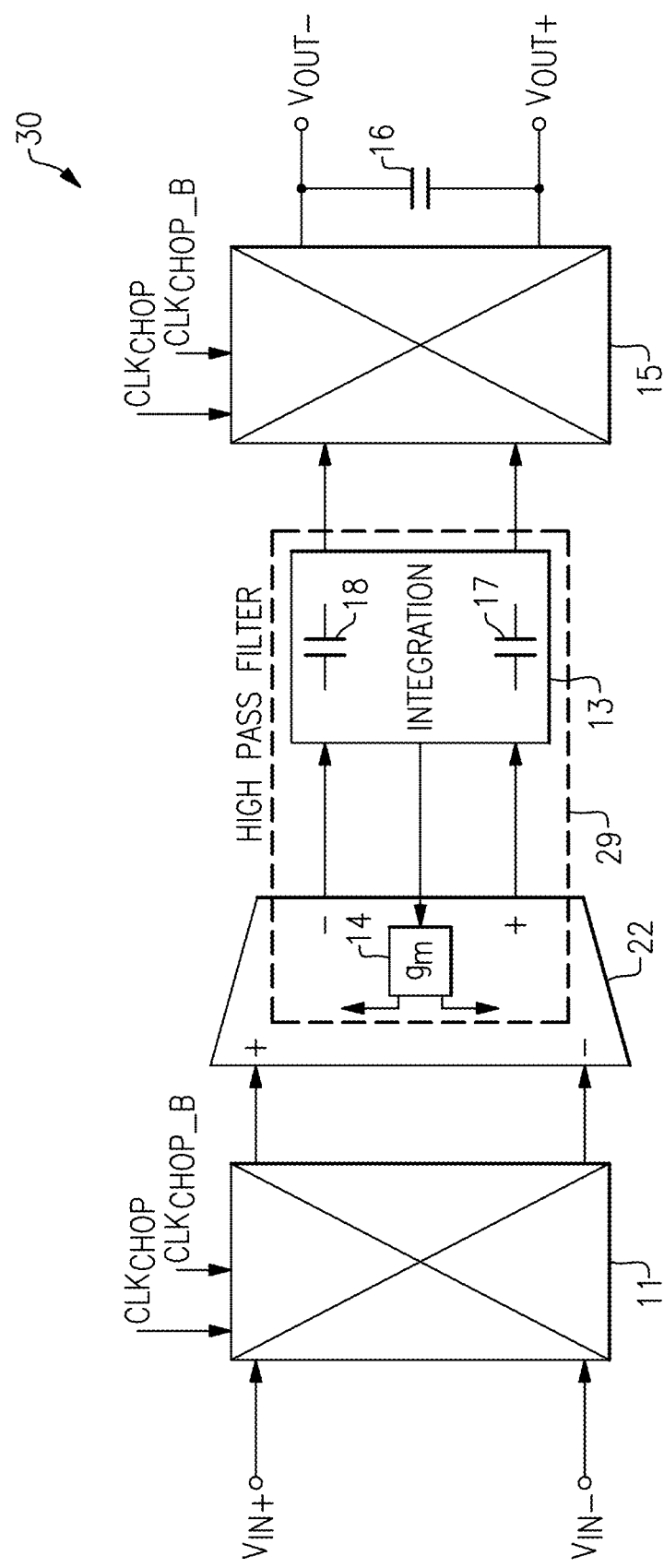
FIG. 2B is a schematic diagram of chopper amplifier circuitry according to another embodiment.

FIG. 2B is a schematic diagram of chopper amplifier circuitry 30 according to another embodiment. The chopper amplifier circuitry 30 includes an input chopping circuit 11, a transconductance amplification stage 22, an integration circuit 13, an output chopping circuit 15, and an accumulation capacitor 16. As shown in FIG. 2B, the transconductance amplification stage 22 includes a transconductance circuit 14, which operates in combination with the integration circuit 13 as a high pass filter 29.

The chopper amplifier circuitry 30 of FIG. 2B is similar to the chopper amplifier circuitry 20 of FIG. 2A, except that the chopper amplifier circuit 30 illustrates an implementation in which the transconductance circuit 14 is integrated in the transconductance amplification stage 22. For example, the transconductance circuit 14 can be implemented in a common circuit layout of the transconductance amplification stage 22 and/or share circuitry (for instance, transistors) of the transconductance amplification stage 22.

In certain implementations, the transconductance circuit 14 corresponds to transconductance provided by back gates of a pair of FETs of the transconductance amplification stage 22. For example, a pair of metal oxide semiconductor (MOS) transistors, such as a differential input pair, a current source pair, and/or other suitable transistors can have back gates controlled by the integration circuit 13. Additionally or alternatively, the transconductance circuit 14 corresponds to transconductance provided by gates of a pair of FETs of the transconductance amplification stage 22, for instance, and additional transistor pair having a differential input that receives a differential integration voltage and a differential output connected along the differential signal path through the transconductance amplification stage 22.

Integrating the transconductance circuit 14 into the transconductance amplification stage 22 can provide a number of advantages, including, but not limited to, reduced component count, smaller circuit area, superior matching, and/or lower power consumption.

Figure 3:
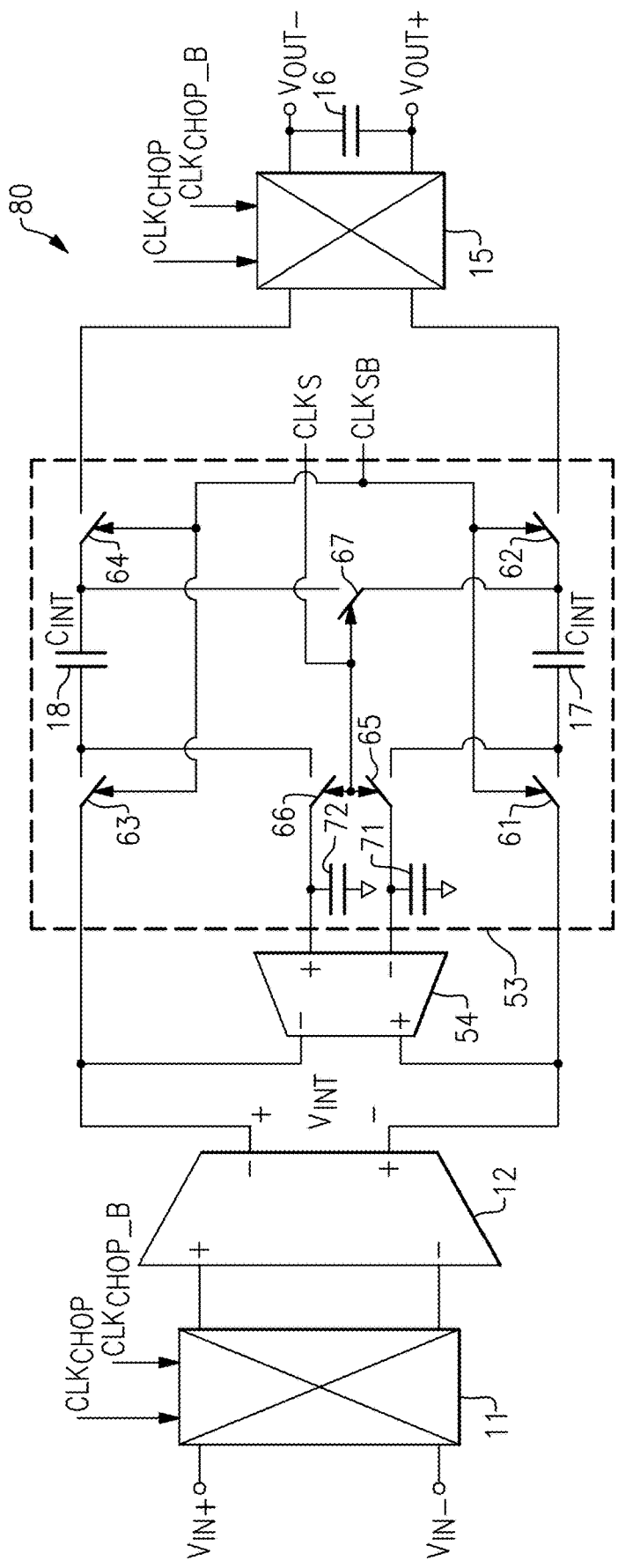
FIG. 3 is a schematic diagram of chopper amplifier circuitry according to another embodiment.
Figure 4:
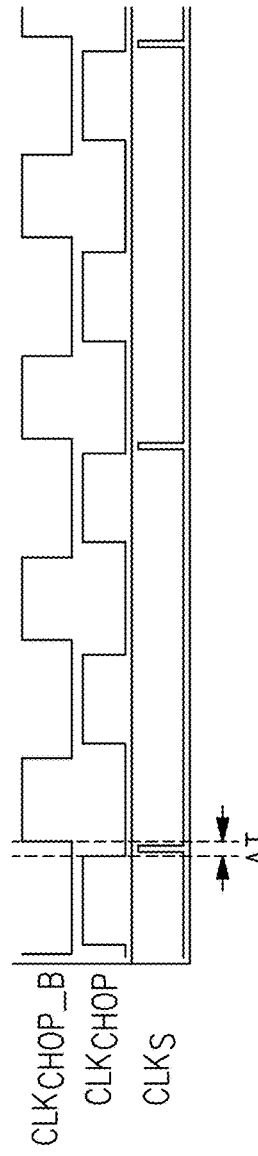
FIG. 4 is one example of a timing diagram for chopper amplifier circuitry.
Figure 5A:
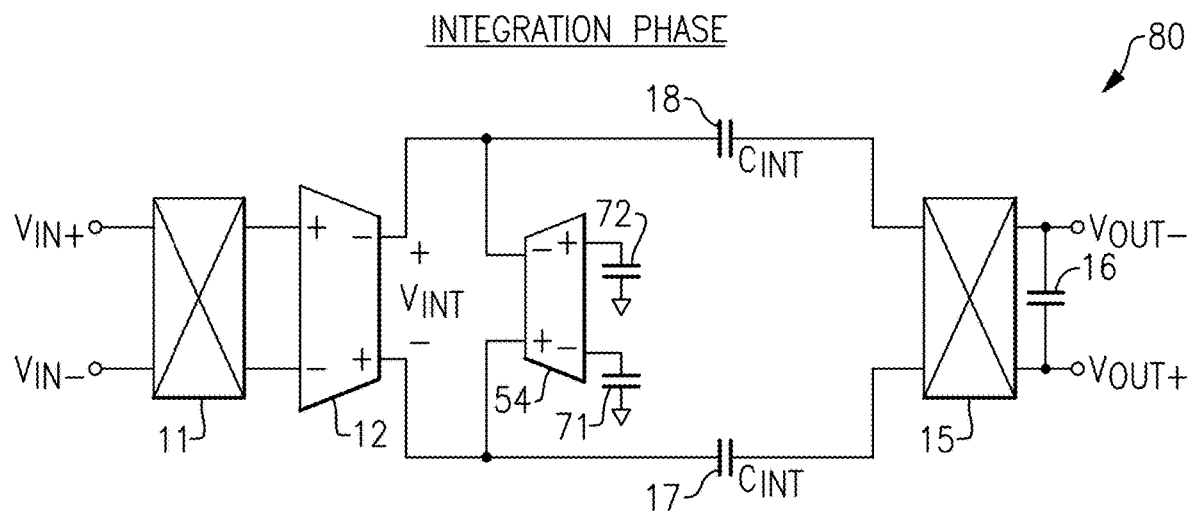
FIG. 5A is a schematic diagram illustrating operation of the chopper amplifier circuitry of FIG. 3 in an integration phase.
Figure 5B:
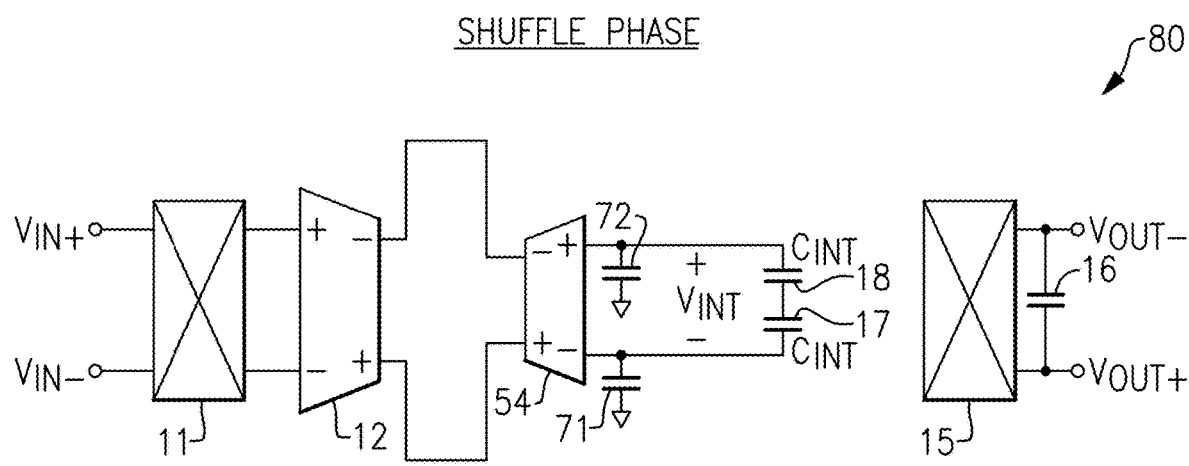
FIG. 5B is a schematic diagram illustrating operation of the chopper amplifier circuitry of FIG. 3 in a shuffle phase.

FIG. 3 is a schematic diagram of chopper amplifier circuitry 80 according to another embodiment. The chopper amplifier circuitry 80 includes an input chopping circuit 11, a transconductance amplification stage 12, a switched capacitor integrator 53, a feedback transconductance amplification stage 54, an output chopper 15, and an accumulation capacitor 16. FIG. 4 is one example of a timing diagram for chopper amplifier circuitry, such as the chopper amplifier circuitry 80 of FIG. 3. FIG. 5A is a schematic diagram illustrating operation of the chopper amplifier circuitry 80 of FIG. 3 in an integration phase. FIG. 5B is a schematic diagram illustrating operation of the chopper amplifier circuitry 80 of FIG. 3 in a shuffle phase.

With reference to FIGS. 3-5B, the chopper amplifier circuitry 80 is similar to the chopper amplifier circuitry 20 of FIG. 2A, except that the chopper amplifier circuitry 80 illustrates specific implementations of the integration circuit 13 and the transconductance circuit 14 of FIG. 2A. Although one embodiment of chopper amplifier circuitry is shown, the teachings herein are applicable to chopper amplifier circuitry implemented in a wide variety of ways.

As shown in FIG. 3, the switched capacitor integrator 53 includes a first integration capacitor 17, a second integration capacitor 18, first to seventh switches 61-67, respectively, a first hold capacitor 71, and a second hold capacitor 72. As shown in FIG. 3, the first to fourth switches 61-64 are controlled by an inverted shuffling clock signal $CLK_{SB}$, while the fifth to seventh switches 65-67 are controlled by a shuffling clock signal $CLK_S$. In certain implementations, the inverted shuffling clock signal $CLK_{SB}$ corresponds to a logically inverted version of the shuffling clock signal $CLK_S$, with or without clock overlap.

The timing diagram shown in FIG. 4 depicts one example of timing of the shuffling clock signal $CLK_S$ relative to the chopping clock signal $CLK_{CHOP}$ and the inverted chopping clock signal $CLK_{CHOP\_B}$. The state of the shuffling clock signal $CLK_S$ controls operation of the chopper amplifier circuitry 80 between the integration phase and the shuffle phase. Although one example of timing is depicted, the chopper amplifier circuitry 80 can operate with other implementations of timing.

The operation of the chopper amplifier circuitry 80 in the integration phase is shown in FIG. 5A. When operating in the integration phase, the integration capacitors 17-18 operate in a portion of the differential signal path between the transconductance amplification stage 12 and the output chopping circuit 15. During the integration phase, the first integration capacitor 17 is charged by a sum of currents from the non-inverted output of the transconductance amplification stage 12 and the non-inverted output of the feedback transconductance amplification stage 54. Likewise, the second integration capacitor 18 is charged by a sum of currents from the inverted output of the transconductance amplification stage 12 and the inverted output of the feedback transconductance amplification stage 54.

The flow of currents results in an integration of charge on the capacitors 17-18. At the end of the integration phase, a net voltage develops from the charge integration onto each capacitor, corresponding to an integration voltage $V_{INT}$ across the differential output of the transconductance amplification stage 12.

During the shuffle phase, the integration capacitors 17-18 are connected in series between the differential input of the feedback transconductance amplification stage 54. Thus, the integration voltage $V_{INT}$ serves as input to the feedback transconductance amplification stage 54 during the shuffle phase. Accordingly, the feedback transconductance amplification stage 54 outputs a differential current that is substantially proportional to the integration voltage $V_{INT}$ but of opposite polarity to an average current to the integration capacitors 17-18 during the integration phase.

By switching the chopper amplifier circuitry 80 between the integration phase and the shuffle phase, the input offset voltage and/or low frequency noise of the transconductance amplification stage 12 is filtered. Thus, low frequency noise that would have otherwise been aliased by the output chopping circuit 15 up to the chopping frequency and its odd harmonics is eliminated or attenuated. Thus, little to no chopping ripple is present at the output of the output chopping circuit 15.

The timing of the clock signals of the chopper amplifier circuitry 80 can be controlled to mitigate an impact of the high pass filtering on the differential input signal being amplified by the chopper amplifier circuitry 80. In certain implementations, the shuffling clock signal $CLK_S$ is operated at a subharmonic multiple of the chopping clock signal $CLK_{CHOP}$.

For example, an implementation of timing in which the shuffling clock signal $CLK_S$ operates at a subharmonic multiple of 2 with respect to the chopping clock signal $CLK_{CHOP}$ is shown in FIG. 4. In the illustrated embodiment, the shuffling clock signal $CLK_S$ is active during a period of non-overlap $\Delta T$ between the chopping clock signal $CLK_{CHOP}$ and the inverted chopping clock signal $CLK_{CHOP\_B}$. Although one example of timing is shown in FIG. 4, other implementations of timing can be used.

In certain implementations, the duration of the shuffling phase is much shorter than the duration of the integration phase, for instance, at least 100 times shorter in duration. Although an example of shuffling phase duration has been provided, other implementations are possible, including, but not limited to, implementations in which the shuffling phase is equal to or longer in duration than the integration phase.

Controlling the timing of the shuffling in this manner can reduce or eliminate an impact of high pass filtering on a transfer function of the chopper amplifier circuitry near the chopping frequency. In certain implementations, a compensation path (for instance, the feedforward compensation path shown in FIG. 13) is included to reduce or eliminate a kink or notch in the transfer function of the chopper amplifier circuitry near the chopping frequency.

Figure 6:
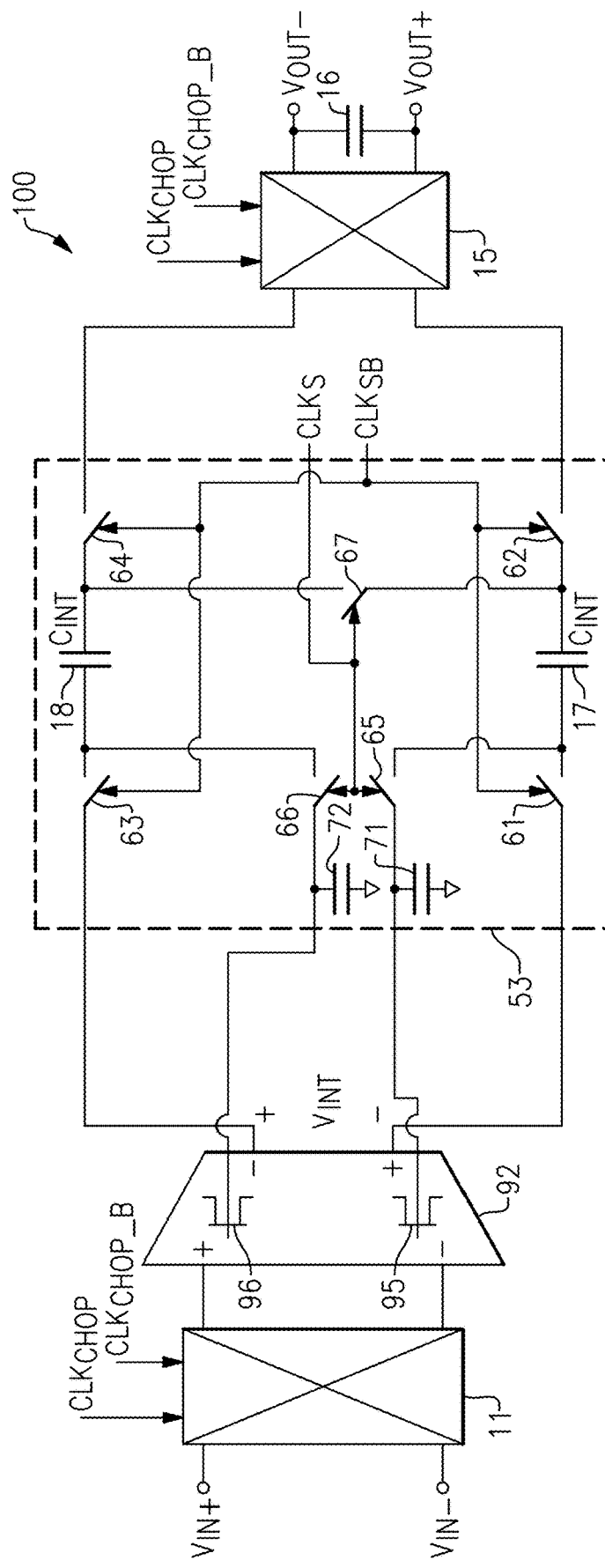
FIG. 6 is a schematic diagram of chopper amplifier circuitry according to another embodiment.

FIG. 6 is a schematic diagram of chopper amplifier circuitry 100 according to another embodiment. The chopper amplifier circuitry 100 of FIG. 6 is similar to the chopper amplifier circuit 80 of FIG. 3, except that the chopper amplifier circuitry 100 omits the feedback transconductance amplification stage 54 of FIG. 3 in favor of using an integrated transconductance circuit of the transconductance amplification stage 92.

In particular, the transconductance amplification stage 92 includes a first FET 95 and a second FET 96 connected along a differential signal path through the stage. Additionally, in the shuffle phase, the integration voltage $V_{INT}$ across the integration capacitors 17-18 is provided as a differential input voltage to the first FET 95 and the second FET 96. In certain implementations, the FETs correspond to MOS transistors. The first FET 95 and the second FET 96 can correspond to a differential input pair, a current source pair, and/or other suitable transistor pair of the transconductance amplification stage 92.

In certain implementations, the differential input voltage is provided between a gate of the first FET 95 and a gate of the second FET 96. For example, the first FET 95 and the second FET 96 can correspond to an additional differential transistor pair connected along a differential signal path through the transconductance amplification stage 92.

In other implementations, the differential input voltage is provided between a back gate of the first FET 95 and a back gate of the second FET 96. Using the back gates of FETs as a transconductance circuit can provide a number of advantages, including, but not limited to, enhanced integration, reduced component count, and/or lower power dissipation relative to the embodiment of FIG. 3.

Figure 7A:
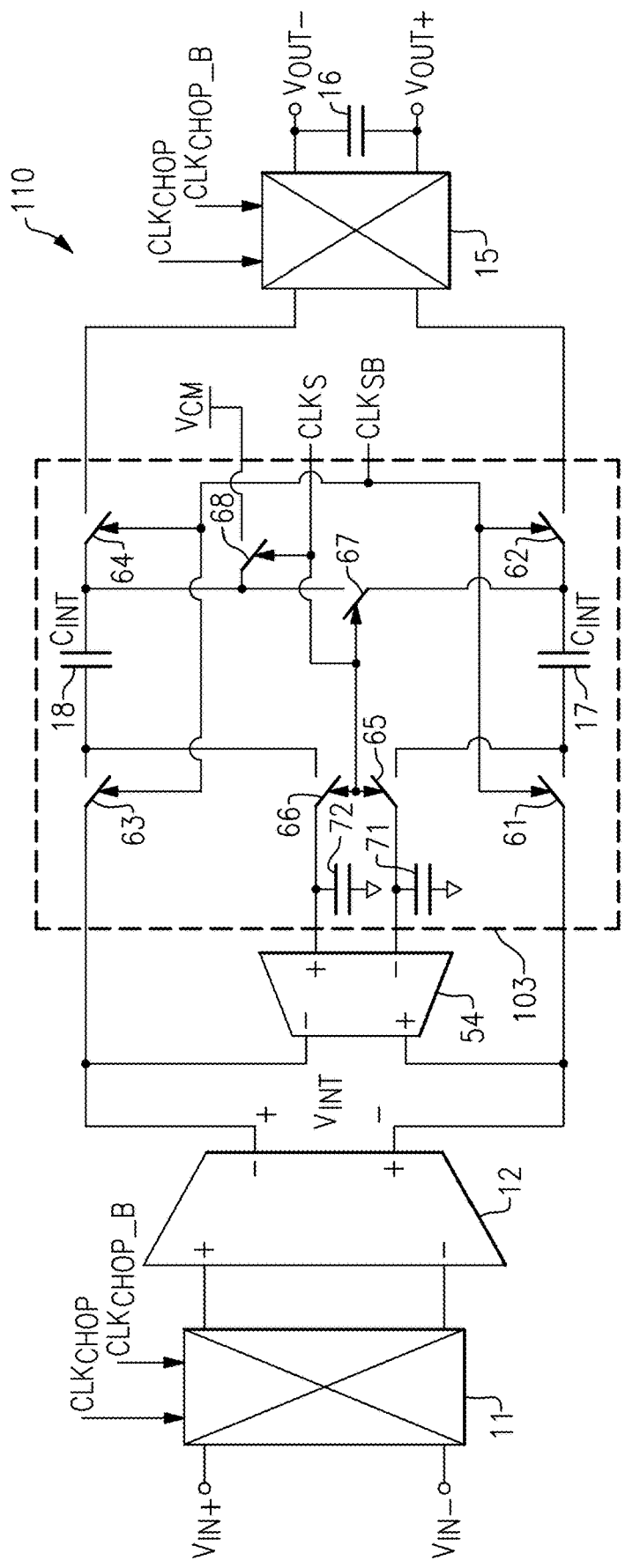
FIG. 7A is a schematic diagram of chopper amplifier circuitry according to another embodiment.

FIG. 7A is a schematic diagram of chopper amplifier circuitry 110 according to another embodiment. The chopper amplifier circuitry 110 of FIG. 7A is similar to the chopper amplifier circuitry 80 of FIG. 3, except that the chopper amplifier circuitry 110 of FIG. 7A includes a different implementation of a switched capacitor integrator 103.

In contrast to the switched capacitor integrator 53 of FIG. 3, the switched capacitor integrator 103 of FIG. 7A further includes an eighth switch 68. As shown in FIG. 7A, the eighth switch 68 includes a first end electrically connected to a node between the first integration capacitor 17 and the second integration capacitor 18, and a second end electrically connected to a common-mode voltage $V_{CM}$. Additionally, the eighth switch 68 is opened and closed based on timing of the shuffle clock signal $CLK_S$.

In the illustrated embodiment, the node between the first integration capacitor 17 and the second integration capacitor 18 is controlled to the common-mode voltage $V_{CM}$ during the shuffle phase (see, for example, FIG. 5B). By controlling the voltage of the node between the integration capacitors 17-18 in this manner, control over a common-mode voltage at the differential output of the transconductance amplification stage 12 is provided.

Figure 7B:
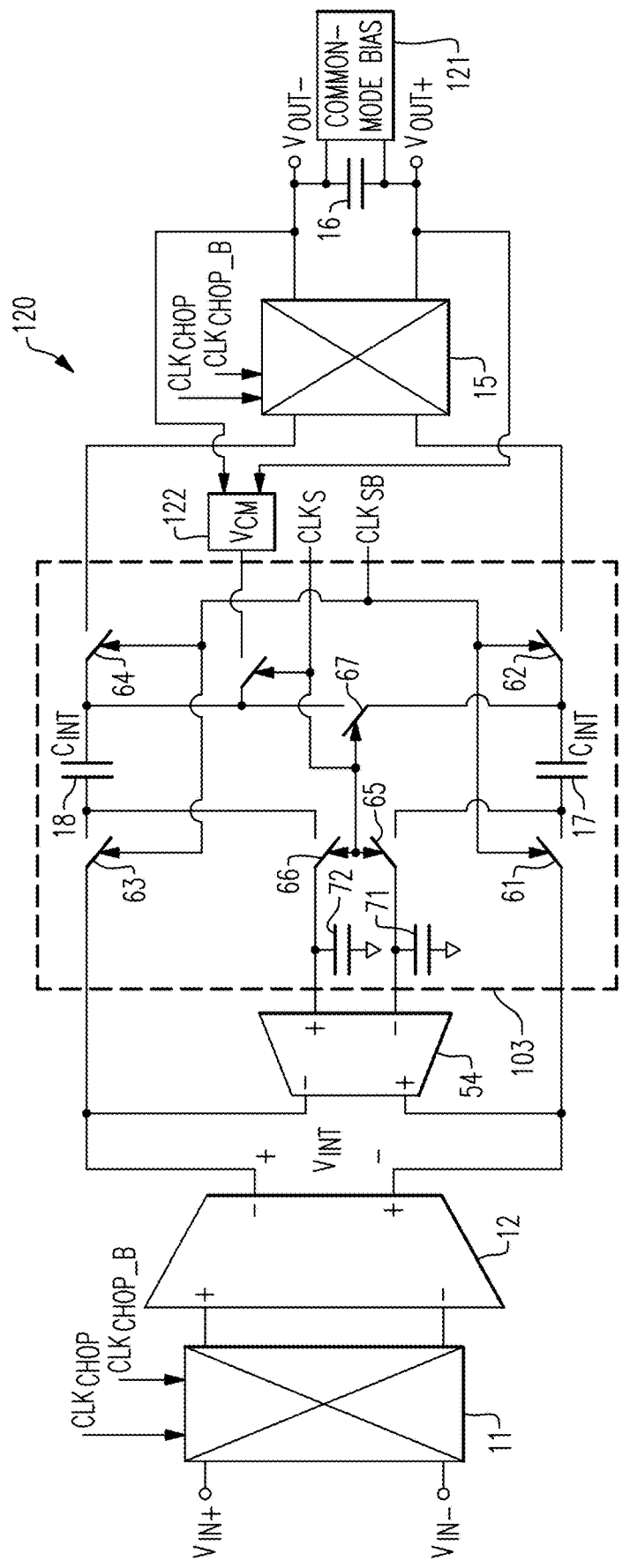
FIG. 7B is a schematic diagram of chopper amplifier circuitry according to another embodiment.

FIG. 7B is a schematic diagram of chopper amplifier circuitry 120 according to another embodiment.

The chopper amplifier circuitry 120 of FIG. 7B is similar to the chopper amplifier circuitry 110 of FIG. 7A, except that the chopper amplifier circuitry 120 of FIG. 7B further includes a common-mode biasing circuit 121 and a common-mode voltage generation circuit 122.

In the illustrated embodiment, the common-mode biasing circuit 121 controls a common-mode bias voltage of the differential output voltage $V_{OUT+}$, $V_{OUT-}$. Additionally, the common-mode voltage generation circuit 122 senses or detects the common-mode voltage of the differential output voltage $V_{OUT+}$, $V_{OUT-}$, and uses the detected voltage to control the common-mode voltage $V_{CM}$ provided to the switched capacitor integrator 103.

Including the common-mode voltage generation circuit 122 aids in controlling the common-mode voltage at the output to the transconductance amplification stage 12 relative to a downstream common-mode voltage of the chopper amplifier.

Figure 8:
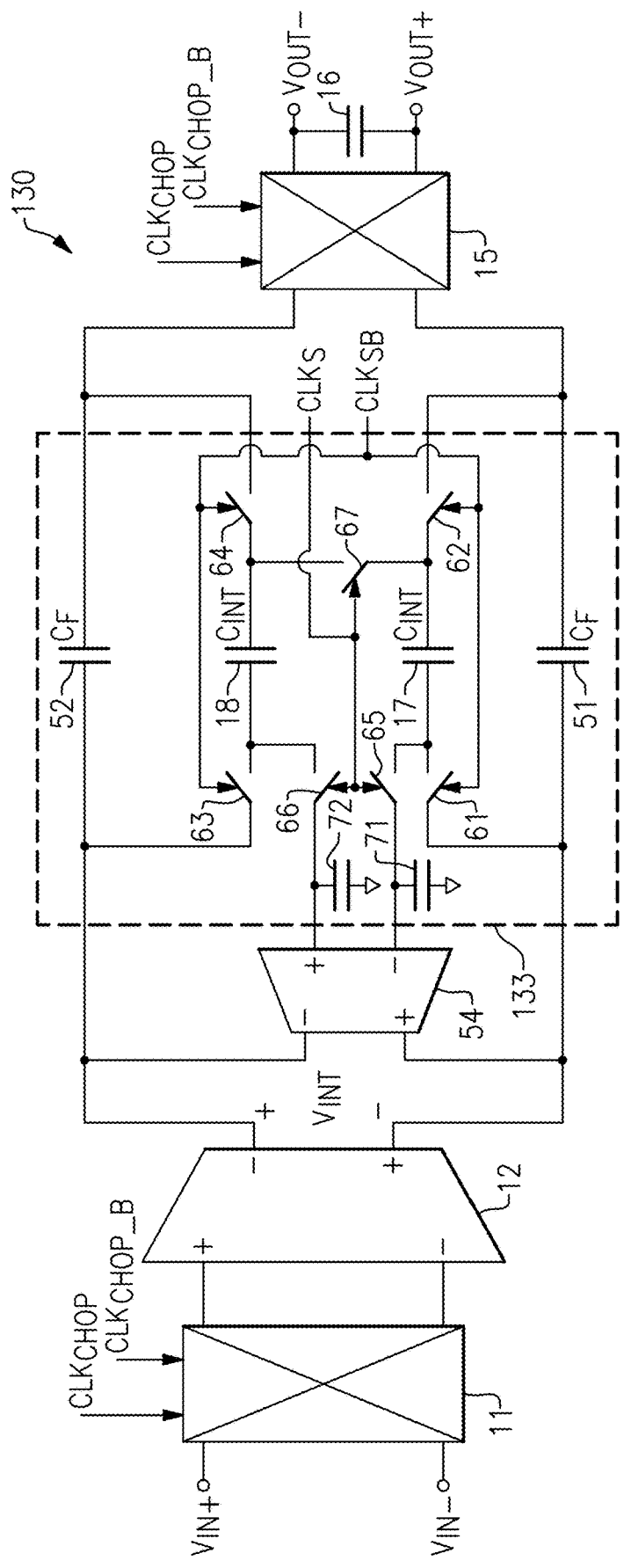
FIG. 8 is a schematic diagram of chopper amplifier circuitry according to another embodiment.

FIG. 8 is a schematic diagram of chopper amplifier circuitry 130 according to another embodiment.

The chopper amplifier circuitry 130 of FIG. 8 is similar to the chopper amplifier circuitry 80 of FIG. 3, except that the chopper amplifier circuitry 130 of FIG. 8 includes a different implementation of a switched capacitor integrator 133.

In contrast to the switched capacitor integrator 53 of FIG. 3, the switched capacitor integrator 133 of FIG. 8 further includes a first fixed signal-path capacitor 51 and a second fixed signal-path capacitor 52. As shown in FIG. 8, the first fixed signal-path capacitor 51 is electrically connected between a first output of the transconductance amplification stage 12 and a first input to the output chopper 15. Additionally, the second fixed signal-path capacitor 52 is electrically connected between a second output of the transconductance amplification stage 12 and a second input to the output chopper 15.

The state of the shuffling clock signal $CLK_S$ controls operation of the chopper amplifier circuitry 133 between the integration phase and the shuffle phase.

When operating in the integration phase, the integration capacitors 17-18 operate in the differential signal path between the transconductance amplification stage 12 and the output chopping circuit 15. During the integration phase, the first integration capacitor 17 and the first fixed signal-path capacitor 51 are charged by a sum of currents from the non-inverted output of the transconductance amplification stage 12 and the non-inverted output of the feedback transconductance amplification stage 54. Likewise, the second integration capacitor 18 and the second fixed signal-path capacitor 52 are charged by a sum of currents from the inverted output of the transconductance amplification stage 12 and the inverted output of feedback transconductance amplification stage 54.

During the shuffle phase, the integration capacitors 17-18 are connected in series between the differential input to the feedback transconductance amplification stage 54, thereby providing the feedback transconductance amplification stage 54 with the integration voltage $V_{INT}$.

By switching the chopper amplifier circuitry 130 between the integration phase and the shuffle phase, the input offset voltage and/or low frequency noise of the transconductance amplification stage 12 is filtered. Thus, low frequency noise that would have otherwise been aliased by the output chopping circuit 15 up to the chopping frequency and its odd harmonics will be significantly attenuated, and little to no chopping ripple is present at the output of the output chopping circuit 15.

In the illustrated embodiment, the fixed signal-path capacitors 51-52 remain in the differential signal path through the chopper amplifier circuitry 130 during both the integration phase and the shuffle phase. In certain implementations, the fixed signal-path capacitors 51-52 have a capacitance of about $C_F$, while the integration capacitors 17-18 have a capacitance of about $C_{INT}$. In certain implementations, $C_{INT}/(C_F+C_{INT})$ controls a gain of feedback provided during the shuffle phase and a corresponding corner frequency of the high pass filter. Thus, the values of $C_{INT}$ and $C_F$ can be selected to achieve performance characteristics desired for a particular application and/or implementation. In one embodiment, at least one of $C_{INT}$ or $C_F$ is controllable (for instance, digitally programmable over a chip interface).

FIG. 9A is another example of a timing diagram for chopper amplifier circuitry. The timing depicted of FIG. 9A illustrates another example of suitable timing for a switched capacitor integrator. Although another example of timing is shown in FIG. 9A, the teachings herein are applicable to chopper amplifier circuitry having timing controlled in a wide variety of ways. Accordingly, other implementations are possible.

The timing diagram of FIG. 9A is similar to the timing diagram of FIG. 4, except that the timing diagram of FIG. 9A illustrates an implementation in which the shuffle clock signal $CLK_S$ operates at about the same frequency as the chopping clock signal $CLK_{CHOP}$. For example, in this embodiment, the shuffle clock signal $CLK_S$ is activated during each period of non-overlap ΔT occurring after a falling edge of the chopping clock signal $CLK_{CHOP}$ and before a rising edge of the inverted chopping clock signal $CLK_{CHOP\_B}$.

FIG. 9B is another example of a timing diagram for chopper amplifier circuitry. The timing depicted of FIG. 9B illustrates another example of suitable timing for a switched capacitor integrator. Although another example of timing is shown in FIG. 9B, the teachings herein are applicable to chopper amplifier circuitry having timing controlled in a wide variety of ways.

The timing diagram of FIG. 9B is similar to the timing diagram of FIG. 4, except that the timing diagram of FIG. 9B illustrates an implementation in which the shuffle clock signal CLK$_S$ is activated during a period of non-overlap ΔT occurring after a falling edge of the inverted chopping clock signal CLK$_{CHOP\_B}$ and before a rising edge of the chopping clock signal CLK$_{CHOP}$.

FIG. 9C is another example of a timing diagram for chopper amplifier circuitry. Although another example of timing is shown in FIG. 9C, the teachings herein are applicable to chopper amplifier circuitry having timing controlled in a wide variety of ways.

The timing diagram of FIG. 9C is similar to the timing diagram of FIG. 9A, except that the timing diagram of FIG. 9C illustrates an implementation in which the shuffle clock signal CLK$_S$ is not activated during every period of non-overlap ΔT occurring after a falling edge of the chopping clock signal CLK$_{CHOP}$ and before a rising edge of the inverted chopping clock signal CLK$_{CHOP\_B}$. Thus, the shuffle clock signal CLK$_S$ is activated irregularly.

In certain implementations, activation of the shuffle clock signal CLK$_S$ during a period of non-overlap is determined randomly or pseudo-randomly. In other implementations, the activation of the shuffle clock signal CLK$_S$ is controlled by a particular activation sequence.

FIG. 9D is another example of a timing diagram for chopper amplifier circuitry. Although another example of timing is shown in FIG. 9D, the teachings herein are applicable to chopper amplifier circuitry having timing controlled in a wide variety of ways.

In the embodiment of FIG. 9D, the shuffle clock signal CLK$_S$ is activated at a higher rate during start-up operation of the chopper amplifier relative to during steady-state operation. For example, after start-up of a chopper amplifier, such as after a supply voltage power-up sequence, the voltages of various nodes of the chopper amplifier circuitry can be relatively far from their quiescent values associated with steady state operation. Activating the shuffle clock signal CLK$_S$ with higher frequency during start-up aids the chopper amplifier circuitry in reaching steady-state operation relatively quickly. Thereafter, the shuffle clock signal CLK$_S$ is activated with a lower frequency, thereby reducing power consumption and/or allowing use of integration capacitors of smaller size.

Figure 10:
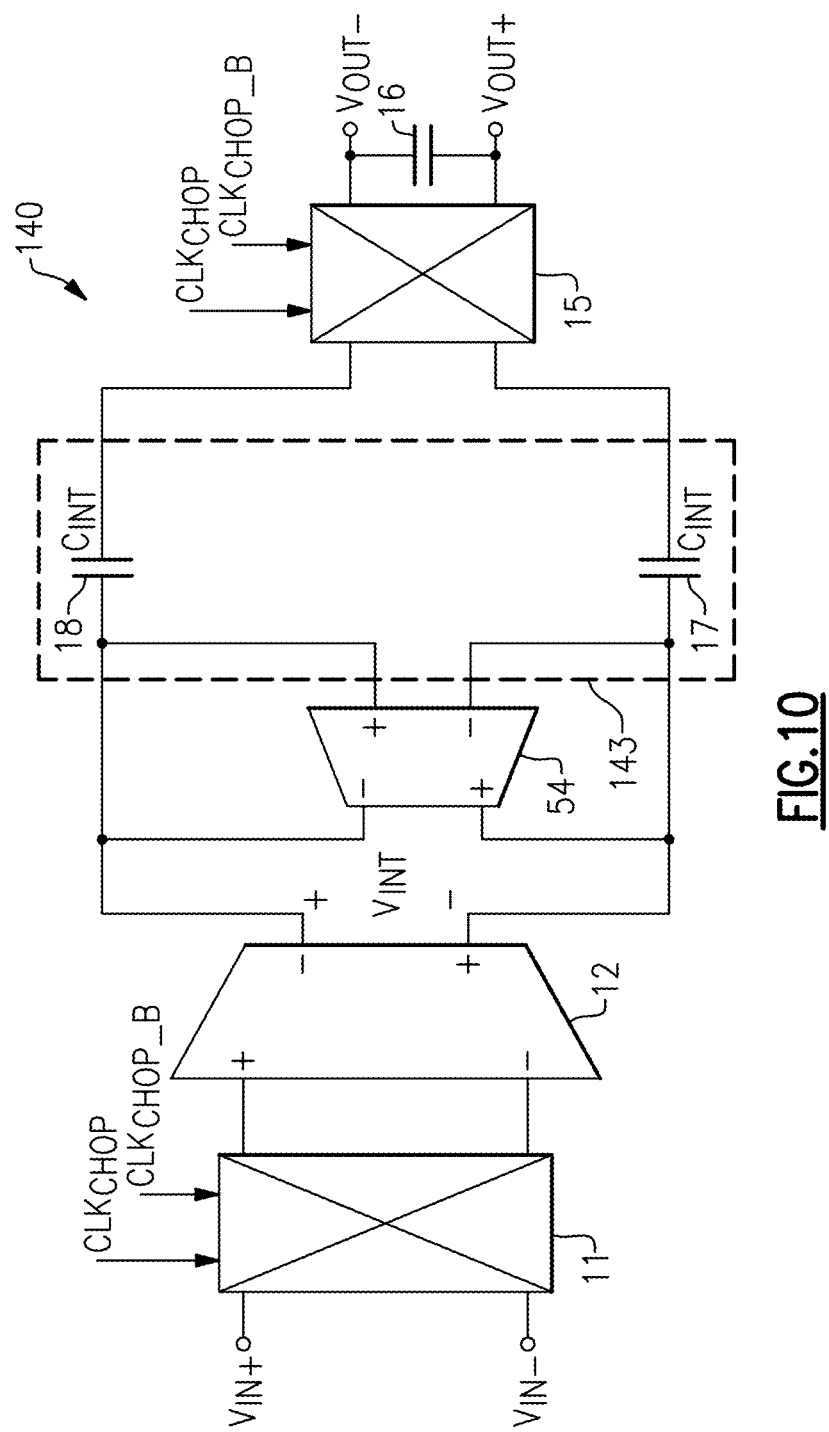
FIG. 10 is a schematic diagram of chopper amplifier circuitry according to another embodiment.

FIG. 10 is a schematic diagram of chopper amplifier circuitry 140 according to another embodiment. The chopper amplifier circuitry 140 includes an input chopping circuit 11, a transconductance amplification stage 12, an integration circuit 143, a feedback transconductance amplification stage 54, an output chopper 15, and an accumulation capacitor 16.

The chopper amplifier circuitry 140 illustrates one embodiment of chopper amplifier circuitry operating using continuous time integration, rather than a switched capacitor integrator. For example, in the illustrated embodiment, the integration circuit 143 includes a first integration capacitor 17 electrically connected between a first output of the transconductance amplification stage 12 and a first input to the output chopper 15, and a second integration capacitor 18 electrically connected between a second output of the transconductance amplification stage 12 and a second input to the output chopper 15. Additionally, the feedback transconductance amplification stage 54 receives the integration voltage V$_{INT}$ across the integration capacitors 17-18, and provides feedback to the differential output of the transconductance amplification stage 12.

Although one embodiment of chopper amplifier circuitry operating using continuous time integration is shown, other implementations are possible. In one example, rather than including the feedback transconductance amplification stage 54, the transconductance circuit can be integrated in the transconductance amplification stage 12.

Figure 11A:
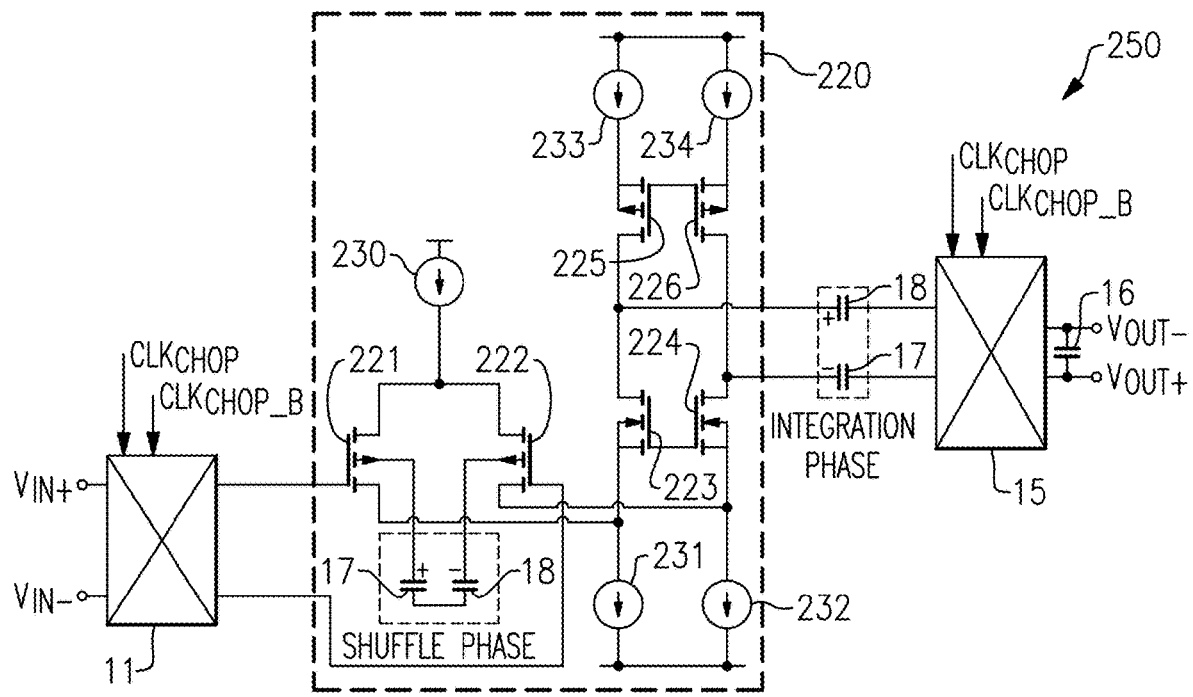
FIG. 11A is a schematic diagram of chopper amplifier circuitry according to another embodiment.

FIG. 11A is a schematic diagram of chopper amplifier circuitry 250 according to another embodiment. The chopper amplifier circuitry 250 of FIG. 11A is similar to the chopper amplifier circuitry 100 of FIG. 6, except that the chopper amplifier circuitry 250 of FIG. 11A illustrates a specific implementation of a transconductance amplification stage 220. For clarity of the figure, switches used for controlling operations between the integration phase and the shuffle phase are omitted from FIG. 11A.

The transconductance amplification stage 220 of FIG. 11A includes a pair of differential input MOS transistors 221-222, a first pair of cascode MOS transistors 223-224, a second pair of cascode MOS transistors 225-226, a tail current source 230, a first pair of folded cascode current sources 231-232, and a second pair of folded cascode current sources 233-234.

In this embodiment, the integration voltage V$_{INT}$ from the integration capacitors 17-18 is provided between the back gates of the pair of differential input MOS transistors 221-222. However, other implementations are possible.

Figure 11B:
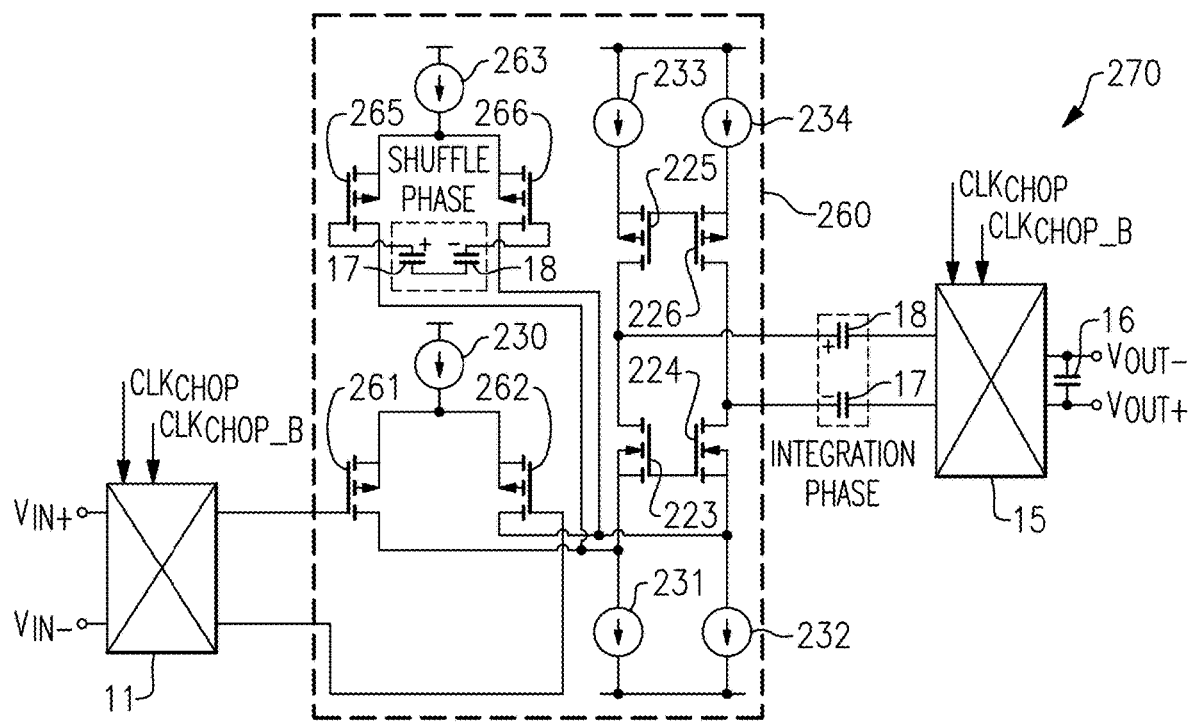
FIG. 11B is a schematic diagram of chopper amplifier circuitry according to another embodiment.

FIG. 11B is a schematic diagram of chopper amplifier circuitry 270 according to another embodiment. The chopper amplifier circuitry 270 of FIG. 11B is similar to the chopper amplifier circuitry 100 of FIG. 6, except that the chopper amplifier circuitry 270 of FIG. 11B illustrates a specific implementation of a transconductance amplification stage 260. For clarity of the figure, switches used for controlling operations between the integration phase and the shuffle phase are omitted from FIG. 11B.

The transconductance amplification stage 260 of FIG. 11B includes a pair of differential input MOS transistors 261-262, a first pair of cascode MOS transistors 223-224, a second pair of cascode MOS transistors 225-226, a first tail current source 230, a second tail current source 263, a first pair of folded cascode current sources 231-232, a second pair of folded cascode current sources 233-234, and a pair of feedback MOS transistors 265-266.

In this embodiment, the integration voltage V$_{INT}$ from the integration capacitors 17-18 is provided between the gates of the feedback MOS transistors 265-266. In this example, the drain of the feedback MOS transistor 265 is connected to the drain of the input MOS transistor 261 and the drain of the feedback MOS transistor 266 is connected to the drain of the input MOS transistor 262. However, other implementations are possible.

Figure 11C:
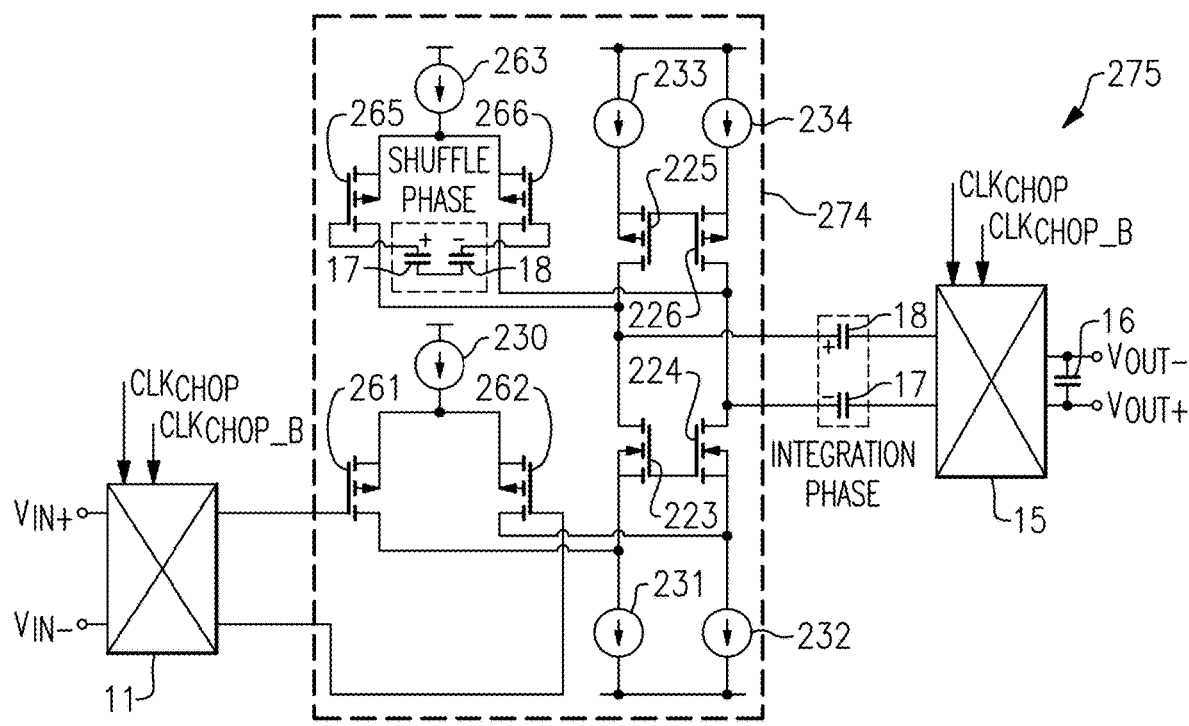
FIG. 11C is a schematic diagram of chopper amplifier circuitry according to another embodiment.

FIG. 11C is a schematic diagram of chopper amplifier circuitry 275 according to another embodiment. For clarity of the figure, switches used for controlling operations between the integration phase and the shuffle phase are omitted from FIG. 11C.

The chopper amplifier circuitry 275 of FIG. 11C is similar to the chopper amplifier circuitry 270 of FIG. 11B, except that the chopper amplifier circuitry 275 includes a transconductance amplification stage 274 in which the drains of the feedback MOS transistors 265-266 are connected to the differential output of the transconductance amplification stage 274, rather than directly to the drains of the input MOS transistors 261-262.

Figure 11D:
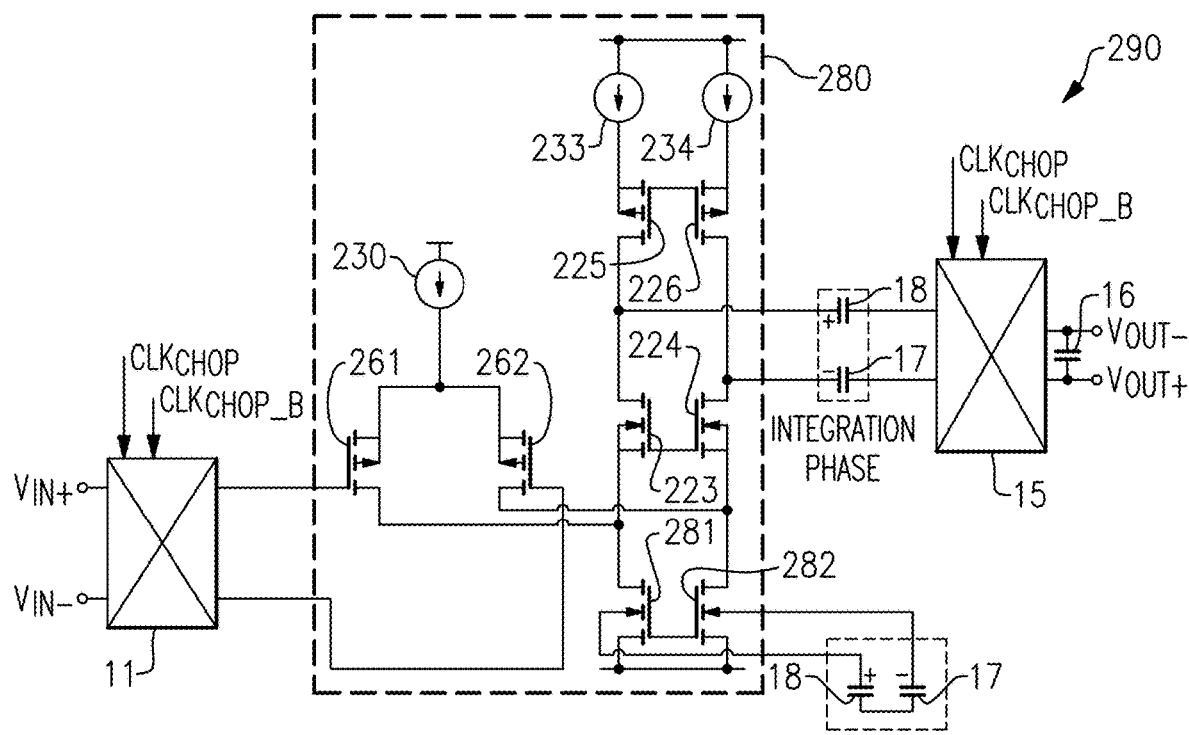
FIG. 11D is a schematic diagram of chopper amplifier circuitry according to another embodiment.

FIG. 11D is a schematic diagram of chopper amplifier circuitry 290 according to another embodiment. The chopper amplifier circuitry 290 of FIG. 11D is similar to the chopper amplifier circuitry 100 of FIG. 6, except that the chopper amplifier circuitry 290 of FIG. 11D illustrates a specific implementation of a transconductance amplification stage 290. For clarity of the figure, switches used for controlling operations between the integration phase and the shuffle phase are omitted from FIG. 11D.

The transconductance amplification stage 290 of FIG. 11D includes a pair of differential input MOS transistors 261-262, a first pair of cascode MOS transistors 223-224, a second pair of cascode MOS transistors 225-226, a tail current source 230, a first pair of folded cascode current sources implemented as a pair of current source MOS transistors 281-282, and a second pair of folded cascode current sources 233-234.

In this embodiment, the integration voltage from the integration capacitors 17-18 is provided between the back gates of the pair of current source MOS transistors 281-282. However, other implementations are possible.

Figure 12A:
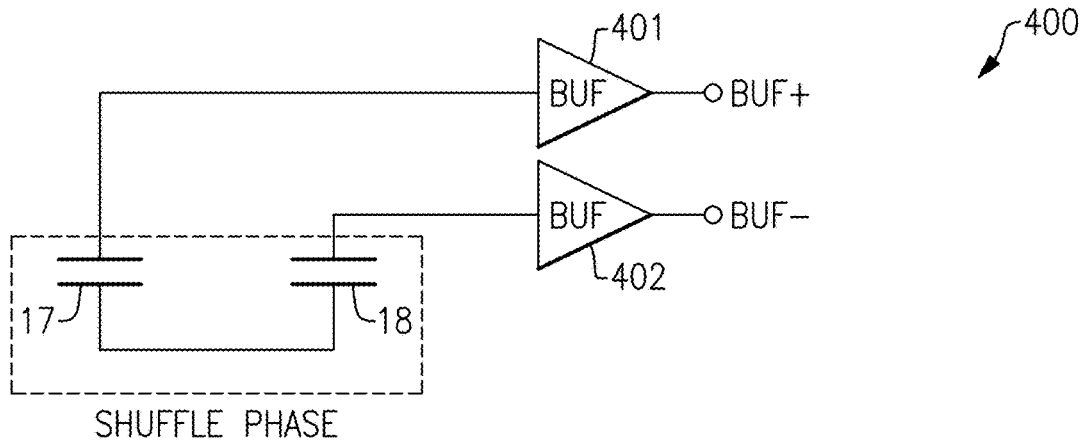
FIG. 12A is a schematic diagram of buffer circuitry according to one embodiment.

FIG. 12A is a schematic diagram of buffer circuitry 400 according to one embodiment. The buffer circuitry 400 of FIG. 12A illustrates one example of buffer circuitry that can be included between integration capacitors and a differential input to a transconductance circuit. For example, the buffer circuitry 400 can be included in any of the integration circuits herein to provide buffering between the integration capacitors 17-18 and the transconductance circuit receiving the integration voltage.

Including buffering, such as the buffer circuitry 400 of FIG. 12A, helps prevent the integration capacitors 17-18 from discharging during the shuffle phase. Furthermore, buffer circuitry can provide biasing that operates a transconductance circuit at a desired bias point.

In the illustrated embodiment, during the shuffle phase, the first integration capacitor 17 and the second integration capacitor 18 are electrically connected in series between an input of the first buffer 401 and an input of the second buffer 402. For clarity of the figure, switches used for controlling operations between the integration phase and the shuffle phase are omitted from FIG. 12A.

As shown in FIG. 12A, the first buffer 401 generates a first buffered output signal BUF+, and the second buffer 402 generates a second buffered output signal BUF−. The voltage difference between the first buffered output signal BUF+ and the second buffered output signal BUF− can serve as a differential input voltage to any of the transconductance circuits described herein.

Figure 12B:
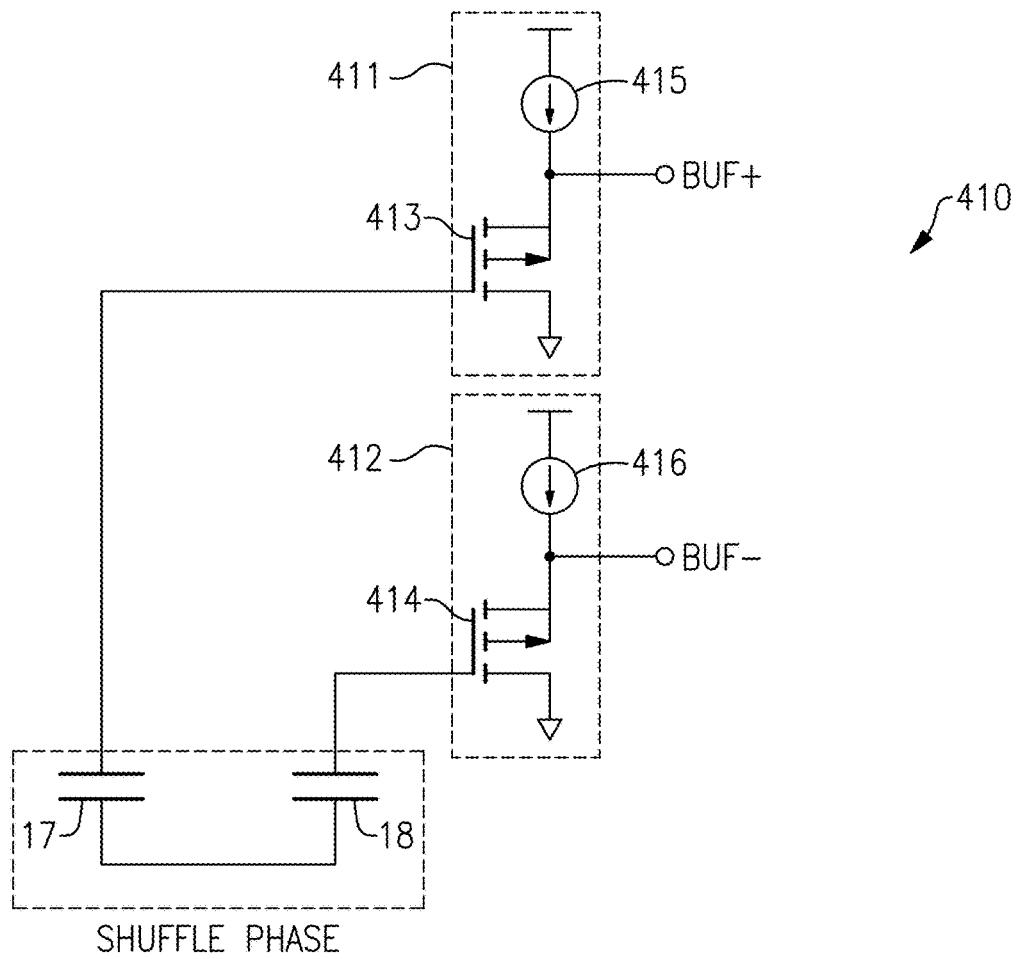
FIG. 12B is a schematic diagram of buffer circuitry according to another embodiment.

FIG. 12B is a schematic diagram of buffer circuitry 410 according to another embodiment. The buffer circuitry 410 of FIG. 12B is similar to the buffer circuitry 400 of FIG. 12A, except that the buffer circuitry 410 includes a specific implementation of the first buffer 401 and the second buffer 402 of FIG. 12A. In particular, the buffer circuitry 410 of FIG. 12B includes a first buffer 411 including a first source-follower MOS transistor 413 and a first bias current source 415. Additionally, the buffer circuitry 410 further includes a second buffer 412 including a second source-follower MOS transistor 414 and a second bias current source 416. Thus, the first and second buffers 411-412 are source-follower buffers, in this embodiment.

Figure 13:
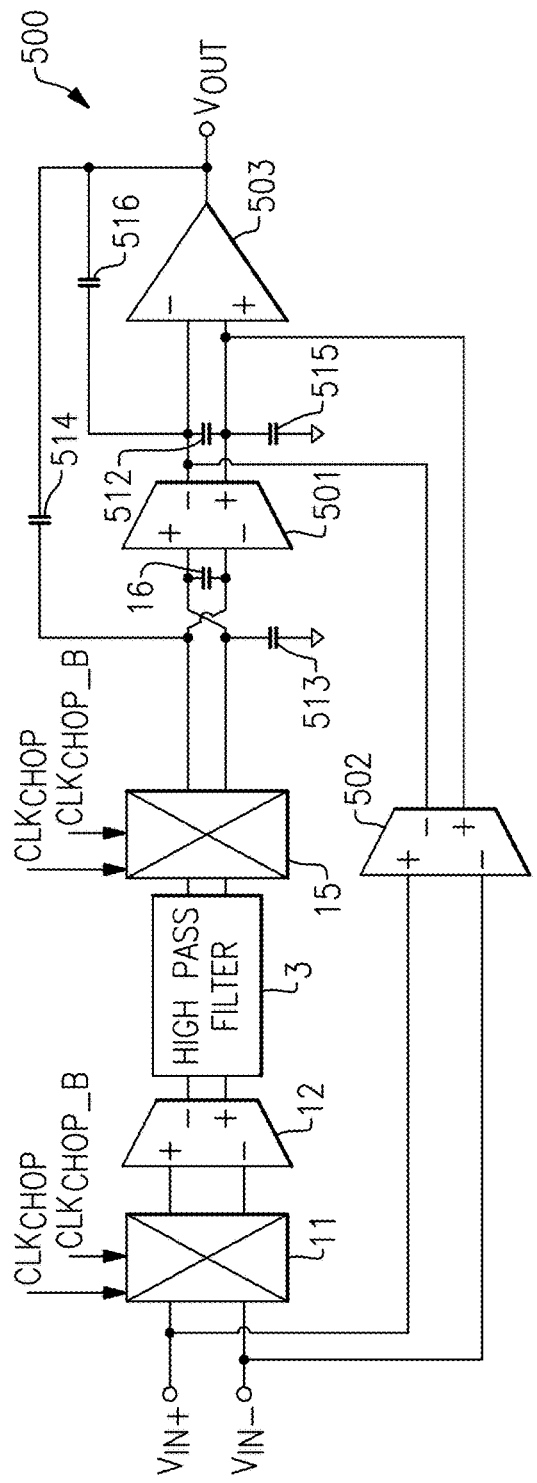
FIG. 13 is a schematic diagram of chopper amplifier according to another embodiment.

FIG. 13 is a schematic diagram of chopper amplifier 500 according to another embodiment. The chopper amplifier 500 includes an input chopping circuit 11, a first transconductance amplification stage 12, a high pass filter 3, an output chopping circuit 15, a second transconductance amplification stage 501, a feedforward transconductance amplification stage 502, an output stage 503, a first accumulation capacitor 16, a second accumulation capacitor 512, a first pair of compensation capacitors 513-514, and a second pair of compensation capacitors 515-516.

Although one embodiment of a chopper amplifier is shown in FIG. 13, the teachings herein are applicable to chopper amplifiers implemented in a wide variety of ways. For example, the chopper amplifier circuitry described herein can include a wide range of components or circuitry to achieve performance characteristics desired for a particular application.

The chopper amplifier 500 includes a low frequency signal path through the input chopping circuit 11, the first transconductance amplification stage 12, the high pass filter 3, the output chopping circuit 15, the second transconductance amplification stage 501, and the output stage 503. The chopper amplifier 500 further includes a high frequency signal path through the feedforward transconductance amplification stage 502 and the output stage 503. The high frequency signal path is also referred to herein as a feedforward signal path.

The low frequency signal path operates to provide amplification to the differential input signal received between the pair of input terminals $V_{IN+}$, $V_{IN-}$. The low frequency signal path also includes the high pass filter 3, which reduces or eliminates input offset voltage and/or low frequency noise, as was described above. The high pass filter 3 can be implemented in accordance with any of the embodiments herein.

In certain implementations, the high pass filter 3 can attenuate components of the differential input signal near the chopping frequency. To provide compensation to the transfer function of the chopper amplifier 500, the high frequency signal path can be included to provide amplification to the differential input signal at or near the chopping frequency.

In another embodiment, the second transconductance amplification stage 501, the feedforward transconductance amplification stage 502, and/or the output stage 503 are omitted to reduce component count and power consumption. Such implementations can result in substantial area and/or power savings, for instance, can be implemented in about half the chip area as a corresponding design including a high frequency signal path.

Figure 14:
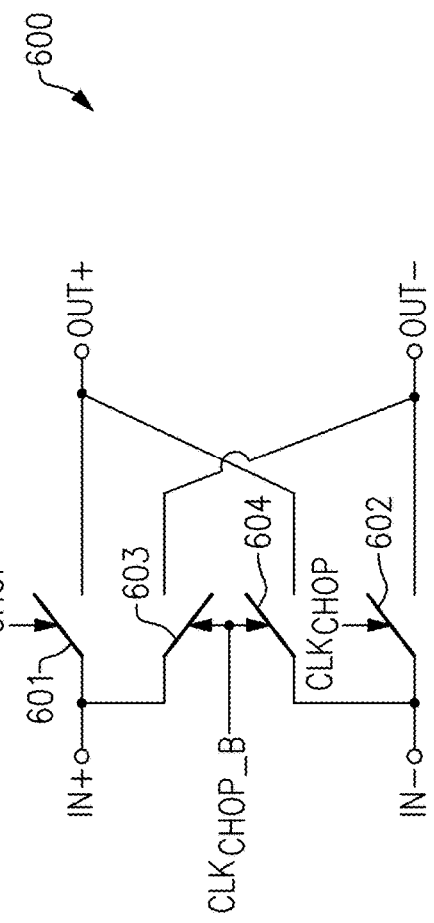
FIG. 14 is a schematic diagram of one example of a chopping circuit.

FIG. 14 is a schematic diagram of one example of a chopping circuit 600. The chopping circuit 600 illustrates one implementation of an input chopping circuit or an output chopping circuit. For example, the chopping circuit 600 illustrates one implementation of the input chopping circuit 11 and output chopping circuit 15 discussed above. However, chopping circuits can be implemented in other ways.

As shown in FIG. 14, the chopping circuit 600 includes a first switch 601 between a non-inverted input terminal IN+ and a non-inverted output terminal OUT+, a second switch 602 between an inverted input terminal IN− and an inverted output terminal OUT−, a third switch 603 between the non-inverted input terminal IN+ and the inverted output terminal OUT−, and a fourth switch 604 between the inverted input terminal IN− and the non-inverted output terminal OUT+.

With continuing reference to FIG. 14, the first switch 601 and the second switch 602 receive a chopping clock signal $CLK_{CHOP}$, while the third switch 603 and the fourth switch 604 receive the inverted chopping clock signal $CLK_{CHOP\_B}$. In certain implementations, the inverted chopping clock signal $CLK_{CHOP\_B}$ corresponds to a logically inverted version of the chopping clock signal $CLK_{CHOP}$, with or without clock overlap.

The clock signals disclosed herein can be implemented in a wide variety of ways, including, for example, by using any suitable clock generator. In certain implementations, a common clock signal is used to synthesize clock signals used for chopping, sampling, shuffling, and/or other operations of a chopper amplifier.

Applications

Devices employing the above described schemes can be implemented into various electronic devices. Examples of electronic devices include, but are not limited to, consumer electronic products, electronic test equipment, communication systems, data converters, etc.

Conclusion

The foregoing description may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while the disclosed embodiments are presented in a given arrangement, alternative embodiments may perform similar functionalities with different components and/or circuit topologies, and some elements may be deleted, moved, added, subdivided, combined, and/or modified. Each of these elements may be implemented in a variety of different ways. Any suitable combination of the elements and acts of the various embodiments described above can be combined to provide further embodiments. Accordingly, the scope of the present invention is defined only by reference to the appended claims.

Although the claims presented here are in single dependency format for filing at the USPTO, it is to be understood that any claim may depend on any preceding claim of the same type except when that is clearly not technically feasible.

What is claimed is:

1. A chopper amplifier with high pass filtering for suppressing chopping ripple, the chopper amplifier comprising:
   an input chopping circuit configured to generate a chopped differential input signal based on chopping a differential input signal;
   an amplification circuit configured to amplify the chopped differential input signal to provide an amplified differential signal at a differential output;
   an output chopping circuit electrically connected to the input chopping circuit by way of a differential signal path through the amplification circuit; and
   a high pass filter configured to provide high pass filtering to the amplified differential signal based on providing feedback from the differential output of the amplification circuit to the differential signal path along a feedback path, wherein the feedback path is configured to compensate for a DC offset of the amplification circuit.

2. A chopper amplifier with high pass filtering for suppressing chopping ripple, the chopper amplifier comprising:
   an input chopping circuit configured to generate a chopped differential input signal based on chopping a differential input signal;
   an amplification circuit configured to amplify the chopped differential input signal to provide an amplified differential signal at a differential output;
   an output chopping circuit electrically connected to the input chopping circuit by way of a differential signal path through the amplification circuit; and
   a high pass filter configured to provide high pass filtering to the amplified differential signal based on providing feedback from the differential output of the amplification circuit to the differential signal path;
   wherein the high pass filter includes an integration circuit configured to integrate the amplified differential signal to generate an integration voltage, and a transconductance circuit configured to amplify the integration voltage.

3. The chopper amplifier of claim 2, wherein the integration circuit comprises a switched capacitor integrator operable in a plurality of phases including an integration phase in which a pair of integration capacitors is electrically connected to the differential output, and a shuffle phase in which the pair of integration capacitors provides the integration voltage to the transconductance circuit.

4. The chopper amplifier of claim 3, wherein the switched capacitor integrator is switched between the plurality of phases based on a shuffle clock signal, wherein the shuffle clock signal is configured to operate with a higher frequency during a start-up operation of the chopper amplifier relative to a steady-state operation of the chopper amplifier.

5. The chopper amplifier of claim 3, wherein the input chopping circuit is controlled by a pair of chopping clock signals having a period of non-overlap, wherein the switched capacitor integrator is configured to operate in the shuffle phase during the period of non-overlap.

6. The chopper amplifier of claim 3, wherein a common-mode voltage of the pair of integration capacitors is controlled during the shuffle phase.

7. The chopper amplifier of claim 6, further comprising a common-mode voltage generation circuit configured to control the common-mode voltage of the pair of integration capacitors based on detecting a bias voltage outputted from a common-mode bias circuit.

8. The chopper amplifier of claim 3, further comprising a first buffer and a second buffer configured to provide a buffered integration voltage to the transconductance circuit, wherein during the shuffle phase the switched capacitor integrator is configured to connect the pair of capacitors in series between an input of the first buffer and an input to the second buffer.

9. The chopper amplifier of claim 2, wherein the transconductance circuit is integrated with the amplification circuit.

10. The chopper amplifier of claim 9, wherein the amplification circuit includes a pair of field-effect transistors (FETs) electrically connected along the differential signal path, the pair of FETs configured to amplify the integration voltage.

11. The chopper amplifier of claim 9, wherein the pair of FETs includes a pair of back gates configured to receive the integration voltage for amplification.

12. The chopper amplifier of claim 9, wherein the pair of FETs corresponds to a pair of differential input transistors or a pair of current source transistors.

13. A method of amplification with suppressed chopping ripple, the method comprising:
- chopping a differential input signal with a chopping clock signal to generate a chopped differential input signal;
- amplifying the differential input signal to generate an amplified differential signal using an amplification circuit;
- chopping the amplified differential signal with the chopping clock signal to generate a chopped output signal; and
- high pass filtering the amplified differential signal by providing feedback from a differential output of the amplification circuit to a differential signal path through the amplification circuit, wherein high pass filtering the amplified differential signal comprises integrating the amplified differential signal to generate an integration voltage and amplifying the integration voltage to generate a feedback signal for the differential signal path.

14. The method of claim 13, wherein high pass filtering the amplified differential signal further comprises connecting a pair of integration capacitors to the differential output during an integration phase and providing the integration voltage to a transconductance circuit using the pair of capacitors in a shuffle phase.

15. The method of claim 14, further comprising controlling a common-mode voltage of the pair of integration capacitors during the shuffle phase.

16. The method of claim 14, wherein providing the integration voltage comprises providing the integration voltage between a back gate of a first FET of the amplification circuit and a back gate of a second FET of the amplification circuit.

17. The method of claim 14, wherein providing the integration voltage comprises providing the integration voltage between a gate of a first FET of the amplification circuit and a gate of a second FET of the amplification circuit.

18. The method of claim 14, wherein providing the integration voltage comprises buffering the integration voltage to generate a buffered integration voltage and amplifying the buffered integration voltage using the transconductance circuit.

19. The chopper amplifier of claim 1, wherein the DC offset comprises an input offset voltage.

20. The chopper amplifier of claim 1, wherein the high pass filter comprises a transconductance circuit along the feedback path and having a differential output connected to the differential output of the amplification circuit.

* * * * *